United States Patent
Himeshima et al.

(10) Patent No.: US 6,633,124 B2
(45) Date of Patent: Oct. 14, 2003

(54) PROCESS FOR PRODUCING AN ORGANIC ELECTROLUMINESCENT DEVICE

(75) Inventors: Yoshio Himeshima, Shiga (JP); Shigeo Fujimori, Shiga (JP); Akira Kohama, Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 10/230,127

(22) Filed: Aug. 29, 2002

(65) Prior Publication Data
US 2003/0011305 A1 Jan. 16, 2003

Related U.S. Application Data

(60) Continuation of application No. 09/811,406, filed on Mar. 20, 2001, which is a division of application No. 09/331,083, filed as application No. PCT/JP97/03721 on Oct. 15, 1997.

(51) Int. Cl.[7] .................................................. H01J 1/62
(52) U.S. Cl. ........................ 313/506; 313/505; 313/509; 313/512
(58) Field of Search ................................. 313/505, 506, 313/509, 512

(56) References Cited

U.S. PATENT DOCUMENTS 4,734,617 A * 3/1988 Jacobs et al. ................ 313/506
5,688,551 A    11/1997 Littman et al.

* cited by examiner

Primary Examiner—Vip Patel
(74) Attorney, Agent, or Firm—Morrison & Foerster LLP

(57) ABSTRACT

A method for producing an organic electroluminescent device, which is provided with first electrodes formed on a substrate, a thin film layer formed on the first electrode containing at least an emitting layer composed of an organic compound and a plurality of second electrodes formed on the thin film layer, and has a plurality of luminescent regions on said substrate, comprising the steps of forming spacers having a height at least partially exceeding the thickness of said thin film layer on the substrate, and vapor-depositing a deposit for patterning while the shadow mask having reinforcing lines formed across its apertures is kept in contact with said spacers. Highly precise fine patterning can be effected under wide vapor deposition conditions without degrading the properties of organic electroluminescent elements, and high stability can be achieved by a relatively simple process without limiting the structure of the electroluminescent device.

3 Claims, 16 Drawing Sheets

Light emission

PRIOR ART

PROCESS FOR PRODUCING AN ORGANIC ELECTROLUMINESCENT DEVICE

REFERENCE TO RELATED APPLICATION

This application is a continuation of Ser. No. 09/811,406, filed Mar. 20, 2001, which is a division of Ser. No. 09/331, 083, filed Jun. 15, 1999, which is a US national stage of PCT/JP97/03721, filed Oct. 15, 1997.

TECHNICAL FIELDS

The present invention relates to a method for producing an organic electroluminescent device having a plurality of luminescent regions of organic electroluminescent elements on one substrate, which can be used in such fields as display elements, flat panel displays, back lights and the interior.

BACKGROUND ART

In recent years, organic electroluminescent elements attract attention as new luminescent elements. In this element, the holes injected from an anode and the electrons injected from a cathode are recombined in an organic emitting layer held between both the electrodes, and C. W. Tang et al. of Kodak demonstrated for the first time that it emitted light at a high luminance at a low voltage (App. Phys. Lett. 51 (12) 21, p. 913, 1987).

FIG. 37 is a sectional view showing a typical structure of an organic electroluminescent element. A hole transport layer 5, an organic emitting layer 6 and second electrodes (cathodes) 8 are laminated on transparent first electrodes (anodes) 2 formed on a glass substrate 1, and the light emitted due to the drive by a drive source 9 is taken outside through the first electrodes and the glass substrate. Such organic electroluminescent elements, with a thin thickness and under low voltage driving, can emit light at a high luminance and also allow multicolored luminescence by selecting organic luminescent materials. Their application as electroluminescent devices such as display elements and displays is being actively studied.

In these case, for example, in a passive matrix type color display as shown in FIGS. 1 to 3, a technique for highly precisely patterning at least an organic emitting layer and second electrodes is needed, and in an active matrix type color display, a technique for highly precisely patterning at least an organic emitting layer is needed.

For such fine patterning, photolithography is conventionally used as a wet process. Japanese Patent Laid-Open (Kokai) No. Hei6-234969 discloses a technique for obtaining an element to allow application of photolithography by devising an organic material.

As methods for patterning the second electrodes without using any wet process, Japanese Patent Laid-Open (Kokai) Nos. Hei5-275172 and Hei8-315981 disclose partition techniques. In the technique of Japanese Patent Laid-Open (Kokai) No. Hei5-275172, partitions are arranged with intervals on a substrate, and an electrodes material is vapor-deposited on the substrate in an oblique direction. In the technique of Japanese Patent Laid-Open (Kokai) No. Hei8-315981, partitions with overhangs are formed on a substrate, and an electrode material is vapor-deposited on the substrate from within an angle range with the vertical direction as the center.

The conventional masking methods are general patterning methods without using any wet process. In these methods, a shadow mask is arranged before a substrate, and a deposit is vapor-deposited through apertures for patterning.

As a fine patterning method by masking, Japanese Patent Laid-Open (Kokai) No. Hei9-115672 discloses a masking technique using a shadow mask with a single layer structure. In this method, a shadow mask wider in mask portion than in aperture width is used for patterning an organic thin film layer and second electrodes for each luminescent color, to allow the production of a practical pitch passive matrix type color display.

On the other hand, though not relating to the method for producing an organic electroluminescent device, Japanese Patent Publication (Kokoku) No. Sho63-38421 discloses a technique for forming a wiring pattern by using a shadow mask with a laminate structure. In this method, a two-layer shadow mask consisting of meshes and a foil with a pattern formed, either of which is a magnetic material, is kept in contact with a substrate by a magnet, for vapor deposition. Since the meshes inhibit the deformation of apertures, a complicated wiring pattern such as a cyclic circuit portion and a curved thin circuit portion can be formed.

DISCLOSURE OF THE INVENTION

However, the above mentioned conventional methods have the following problems.

According to said photolithographic method, since the organic thin film layer used as a component of an organic electroluminescent element is generally poor in the durability against water, organic solvents and chemical solutions, the performance of the organic electroluminescent element is remarkably degraded. Furthermore, to obtain an organic electroluminescent element allowing the application of a wet process, the materials used are limited.

According to the partition methods, since patterning is achieved by using the shadows of the deposit formed by partitions, highly precise patterning cannot be achieved when vapor deposition is effected at various angles or when vapor strays behind the partitions in a large quantity. So, these methods are not suitable for larger substrate areas, higher vapor deposition rates or more highly precise patterning. Furthermore, since regions free from the second electrodes called dead spaces corresponding to the shadows of the deposit exist on the organic thin film layer, the organic electroluminescent element tends to be deteriorated by the invasion of water, etc. from there. Moreover, it is not easy to stably form partitions with a large sectional aspect ratio and specially formed partitions with overhangs on the entire surface of the substrate.

In the conventional masking methods, the vapor strays due to the poor contact between the substrate and the shadow mask. Especially when a shadow mask extremely narrow in the mask portion compared to the apertures is used, for example, for patterning second electrodes formed in stripes, the apertures can be deformed due to insufficient strength of the shadow mask. So, it is difficult to highly precisely achieve the fine patterning in sub-millimeter ranges required for displays, etc.

In the masking method using a shadow mask with a single layer structure, though the mask portion is relatively wide, the problem that the apertures are deformed cannot be solved, and patterning at high accuracy cannot be achieved yet. Furthermore, since the organic thin film layer and the second electrodes are laminated in the same flat form, a plurality of electrode material evaporation steps are necessary for forming the second electrodes, and in addition, the element obtained can be applied only as a display structure in which the second electrodes can function as a data line.

The masking method using a shadow mask with a laminate structure cannot be applied for forming a fine pattern of sub-millimeter ranges since the conventional wiring patterns are generally formed in millimeter ranges. Furthermore, since a shadow mask prepared by placing a patterned foil on highly rough meshes is used, the shadow mask is not sufficient in flatness or accuracy, and it is difficult to highly precisely achieve a fine pattern disadvantageously. Furthermore, since this method forcibly keeps the shadow mask in contact with the substrate by a magnet, the shadow mask easily flaws the organic thin film layer when the organic thin film layer on which the second electrodes are formed is very soft compared to a ceramic substrate, etc. So, since an undesirable accident such as shortcircuiting between the first electrodes and the second electrodes can occur, this method cannot be applied for patterning in an organic electroluminescent device.

As described above, according to the prior arts, it is difficult to highly precisely and stably achieve the fine patterning necessary for production of an organic electroluminescent device, without damaging the organic thin film layer.

The object of the present invention is to solve the above problems by providing a method for producing an organic electroluminescent device which allows highly precise fine patterning under various vapor deposition conditions without degrading the properties of the organic electroluminescent elements and can achieve high stability by a relatively simple process without limiting the structure of the electroluminescent device.

THE MOST PREFERRED EMBODIMENT OF THE INVENTION

The object described above can be achieved by the present invention described below.

The present invention is a method for producing an organic electroluminescent device, which is provided with first electrodes formed on a substrate, a thin film layer formed on the first electrode containing at least an emitting layer composed of an organic compound, and a plurality of second electrodes formed on the thin film layer, and has a plurality of luminescent regions on said substrate, comprising the steps of forming spacers having a height at least partially exceeding the thickness of said thin film layer, on the substrate, and vapor-depositing a material for patterning while a shadow mask having reinforcing lines formed across its apertures is kept in contact with said spacers.

The organic electroluminescent device in the present invention has a plurality of luminescent regions of organic electroluminescent elements on one substrate. The organic electroluminescent device produced according to the production method of the present invention is described below. However, the production method of the present invention is not limited to the organic electroluminescent devices of the types and structures illustrated in this specification, and can be applied to organic electroluminescent devices with desired structures irrespective of types such as segment type, passive matrix type and active matrix type and irrespective of the number of luminescent colors such as multicolor type and monochromatic type.

Figure 1:
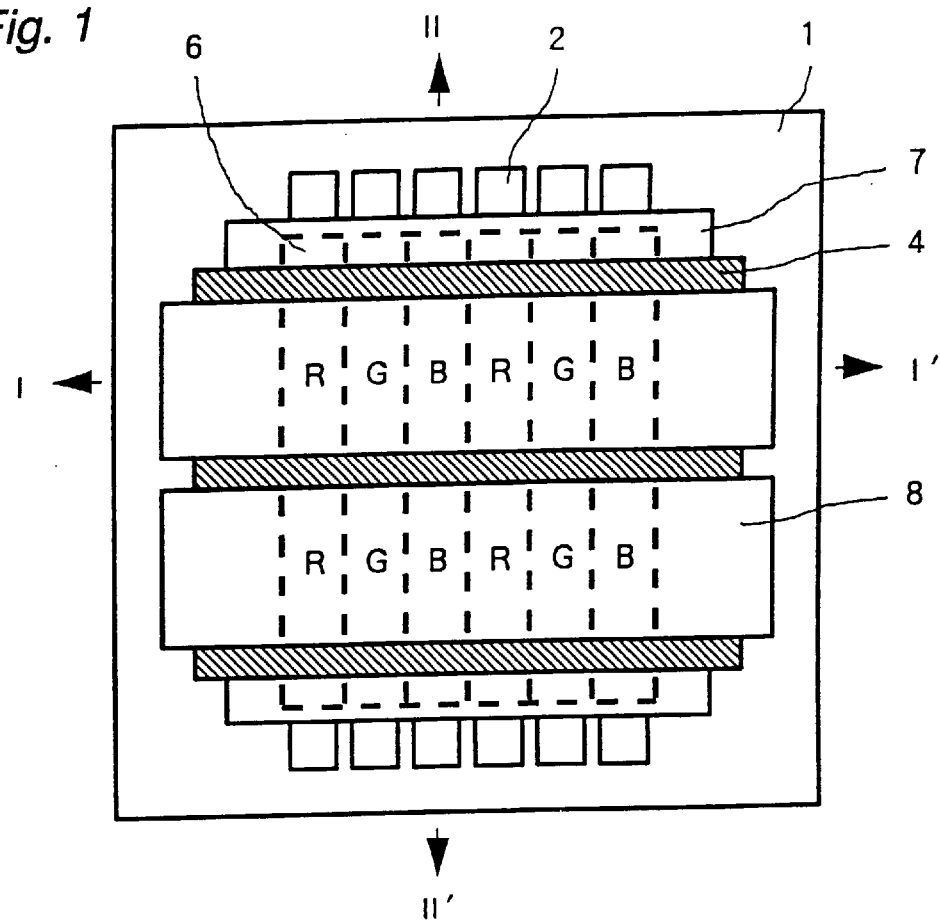
FIG. 1 is a plan view showing an example of the organic electroluminescent device produced according to the present invention.
Figure 2:
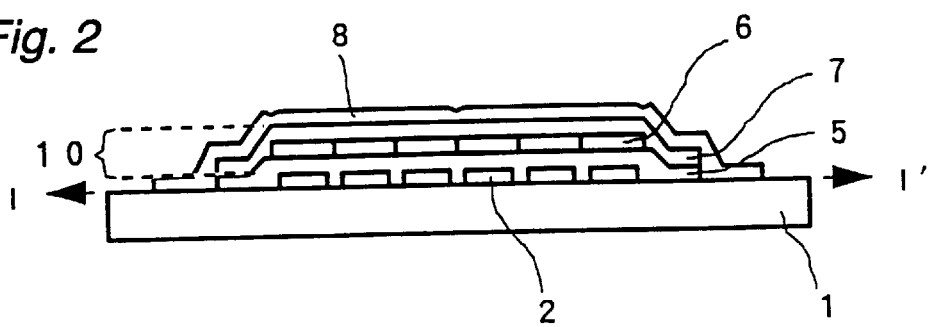
FIG. 2 is a sectional view along I–I' of FIG. 1.
Figure 3:
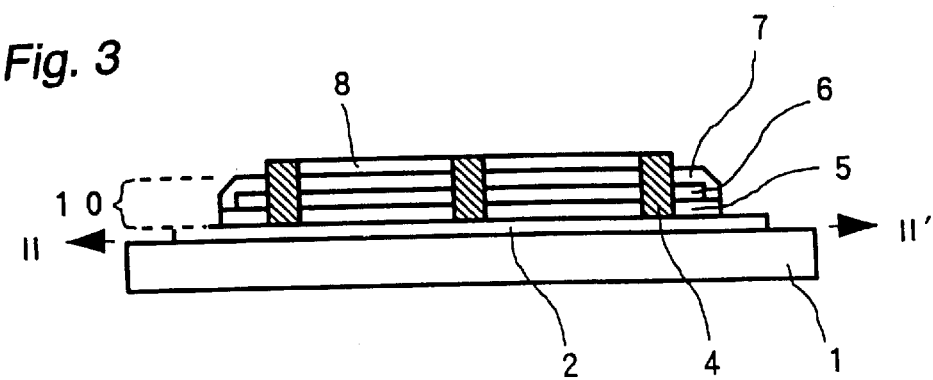
FIG. 3 is a sectional view along II–II' of FIG. 1.

An example of the organic electroluminescent device produced according to the production method of the present invention is shown in FIGS. 1 to 3. First electrodes 2 formed in stripes on a substrate 1, a thin film layer 10 containing an emitting layer 6 composed of an organic compound patterned on the first electrode, and second electrodes 8 formed in stripes in the direction perpendicular to the first electrodes are laminated on the substrate 1, to form a plurality of luminescent regions with organic electroluminescent element structures at the intersections between both the first and second electrodes. Since the respective luminescent regions can emit limit in red (R), green (G) and blue (B) by using different materials for the emitting layer, the passive matrix type electroluminescent device can be driven line-scanningly to display an image, etc. in color. Furthermore, on the substrate, spacers 4 with a height exceeding the thickness of the thin film layer are formed.

The first and second electrodes are only required to be electrically conductive to allow sufficient supply of electric current for luminescence of the organic electroluminescent elements, but it is preferable that at least either the first or second electrodes are transparent for taking out light.

If the transparent electrodes have a visible light transmittance of 30% or more, they can be used without any large problem, but it is ideally preferable that the transmittance is close to 100%. Basically it is preferable that the electrodes have similar transmittance over the entire visible light range. If it is wished to change the luminescent color, the electrodes can also be made positively photoabsorbable. In this case, any color change method by use of a color filter or interference filter is technically easy. The transparent electrode material often used is at least one element selected from indium, tin, gold, silver, zinc, aluminum, chromium, nickel, oxygen, nitrogen, hydrogen, argon and carbon, but inorganic conductive materials such as copper iodide and copper sulfide and conductive polymers such as polythiophene, polypyrrole and polyaniline can also be used. The material used is not especially limited.

Preferable materials for the first electrodes include tin oxide, zinc oxide, indium oxide, indium tin oxide (ITO), etc. to be formed on a transparent substrate. For application as a display, etc. requiring patterning, it is especially preferable to use ITO excellent in processability for the first electrodes. For higher electric conductivity, ITO can contain a small amount of a metal such as silver or gold. Furthermore, tin, gold, silver, zinc, indium, aluminum, chromium and nickel can also be used as guide electrodes of ITO. Above all, chromium is a preferable guide electrode material since it can have both the functions of black matrix and guide electrodes. In view of the power consumption of the organic electroluminescent device, it is preferable that the resistance of ITO is low. An ITO substrate of 300 Ω/sq. or less can function as first electrodes, but since an ITO substrate of about 10 Ω/sq. can be easily supplied at present, a low resistance material can also be used. The thickness of ITO can be selected as desired to suit the resistance value, but usually, 100 to 300 nm thick ITO is often used. The material of the transparent substrate is not especially limited, and a plastic sheet or film made of a polyacrylate, polycarbonate, polyester, polyimide or aramid can be used. A preferable material is a glass sheet. Soda lime glass, no-alkali glass, etc. can be used, and the thickness required is 0.5 mm or more since the thickness is only required to be enough to keep the mechanical strength. As for the material of glass, since it is better that the amount of ions dissolved from the glass is smaller, no-alkali glass is preferable, but the marketed soda lime glass coated with silicon dioxide, etc. as a barrier can also be used. The method for forming ITO is not especially limited, and can be selected from electron beam evaporation, sputtering evaporation, chemical reaction, etc.

The second electrode material is not especially limited either. When ITO is used as the first electrodes, the second electrodes are required to function as cathodes to allow efficient injection of electrons into the organic electroluminescent elements since ITO functions generally as anodes. Therefore, as the second electrode material, a low work function metal such as an alkali metal can also be used, but considering the stability of electrodes, it is preferable to use a metal such as platinum, gold, silver, copper, iron, tin, aluminum, magnesium or indium, etc., or an alloy consisting of any of these metals and a low work function metal. Furthermore, stable electrodes can also be obtained with a high electron injection efficiency kept, by doping a slight amount of a low work function metal into the thin film layer of organic electroluminescent elements or forming a layer of a metal salt such as lithium fluoride thinly on the thin film layer beforehand, and subsequently forming second electrodes of a relatively stable metal. The method for forming the second electrodes is not especially limited either as far as it is a dry process such as resistance heating evaporation, electron beam evaporation, sputtering evaporation or ion plating.

The thin film layer contained in the organic electroluminescent elements can be any of 1) hole transport layer/emitting layer, 2) hole transport layer/emitting layer/electron transport layer, 3) emitting layer/electron transport layer and 4) a emitting layer with the above layer constituting materials mixed in a layer. That is, as far as an emitting layer composed of an organic compound exists as an element component, a multilayer laminate structure of any one of the above 1) to 3) or a one emitting layer containing luminescent materials alone or luminescent materials, hole transport material and electron transport material as in 4) can be used.

The hole transport layer is formed by a hole transport material alone or a hole transport material and a high molecular binder. Preferable hole transport materials include low molecular compounds, for example, triphenylamines such as N,N'-dipheny-N,N'-di(3-methylphenyl)-1,1'-diphenyl-4,4'-diamine (TPD) and N,N'-diphenyl-N,N'-dinaphthyl-1,1'-diphenyl-4,4'-diamine (NPD), heterocyclic compounds such as N-isopropylcarbazole, pyrazoline derivatives, stylbene compounds, hydrazone compounds, oxadiazole derivatives and phthalocyanine derivatives, and polymers such as polycarbonates with any of said low molecular compounds at the side chains, styrene derivatives, polyvinylcarbazole and polysilanes.

In the application as a passive matrix type electroluminescent device, the respective organic electroluminescent elements are short in luminescent time, and it is required to emit light at a high luminance momentarily by feeding pulse currents. In this case, the hole transport material is required to have not only excellent hole transportability and stable film formability, but also good electron blocking property for preventing the decline of luminescence efficiency caused by the leak of electrons in the hole transport layer. To satisfy the above properties in good balance, in the production method of the present invention, it is especially preferable to contain a step of forming an organic layer of an organic compound containing the biscarbazolyl structure shown below. Chemical formula:

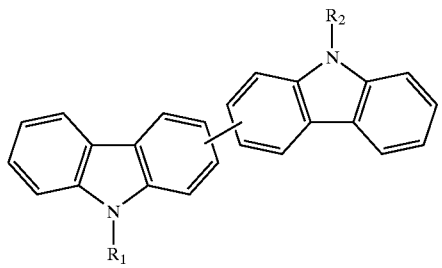

where R and R are selected from hydrogen atom, alkyl groups, halogen atoms, aryl groups, aralkyl groups and cycloalkyl groups. Furthermore, the carbazolyl structure can be connected with one or more substituent groups selected from alkyl groups, aryl groups, aralkyl groups, carbazolyl group, substituted carbazolyl groups, halogen atoms, alkoxy groups, dialkylamino groups and trialkylsilyl groups.

Preferable luminescent materials include low molecular compounds such as anthracene derivatives, pyrene derivatives, 8-hydroxyquinolinealuminum derivatives, bis-styrylanthracene derivatives, tetraphenylbutadiene derivatives, cumarine derivatives, oxadiazole derivatives, distyrylbenzene derivatives, pyrrolopyridine derivatives, perinone derivatives, cyclopentadiene derivatives, oxadiazole derivatives and thiadiazolopyridine derivatives respectively conventionally known as light emitters, and polymers such as polyphenylenevinylene derivatives, polyparaphenylene derivatives and polythiophene derivatives. Preferable dopants to be doped into the emitting layer include rubrene, quinacridone derivatives, phenoxazone derivatives, DCM, perinone derivatives, perylene derivatives, cumarine derivatives and diazaindacene derivatives, etc.

It is preferable that the electron transport material has large electron affinity, large electron mobility and stable thin film formability, since it is required to efficiently transport the electrons injected from cathodes. Preferable materials satisfying these properties include 8-hydroxyquinonealuminum derivatives, hydroxybenzoquinoneberyllium derivatives, oxadiazole derivatives such as 2-(4-biphenyl)-5-(4-t-butylphenyl)-1,3,4-oxadiazole (t-BuPBD), 1,3-bis(4-t-butylphenyl-1,3,4-oxadizolyl) biphenylene (OXD-1) and 1,3-bis(4-t-butylphenyl-1,3,4-oxadizolyl)phenylene (OXD-7), triazole derivatives, phenanthroline derivatives, etc.

The materials used for the hole transport layer, emitting layer and electron transport layer can respectively singly form the respective layers, but can also be dispersed into any high molecular binder, for example, a solvent soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, hydrocarbon resin, ketone resin, phenoxy resin, polysulfone, polyamide, ethyl cellulose, vinyl acetate, ABS resin or polyurethane resin, or a setting resin such as phenol resin, xylene resin, petroleum resin, urea resin, melamine resin, unsaturated polyester resin, alkyd resin, epoxy resin or silicone resin.

The methods for forming the hole transport layer, emitting layer, electron transport layer, etc. are not especially limited and can be resistance heating evaporation, electron beam evaporation, sputtering evaporation, etc. However, generally such methods as resistance heating evaporation and electron beam evaporation are preferable in view of properties. The thicknesses of the organic layers cannot be limited since they relate to resistance values, but are practically selected in a range of 10 to 1000 nm.

Furthermore, the hole transport layer and the electron transport layer can also be wholly or partially made of an inorganic material. Preferable materials include inorganic semiconductive materials such as silicon carbide, gallium nitride, zinc selenide and zinc sulfide.

Figure 4:
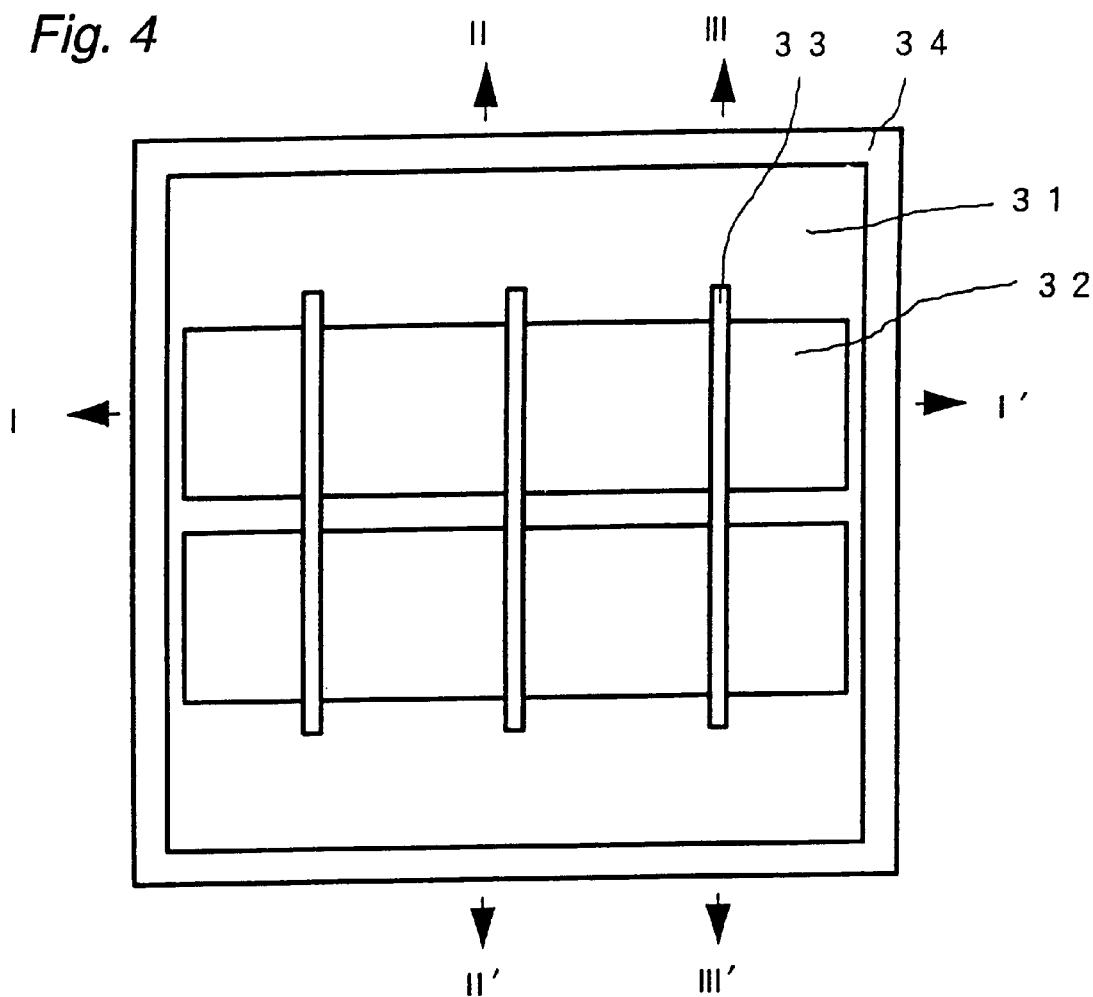
FIG. 4 is a plan view showing an example of the shadow mask used in the present invention.
Figure 5:
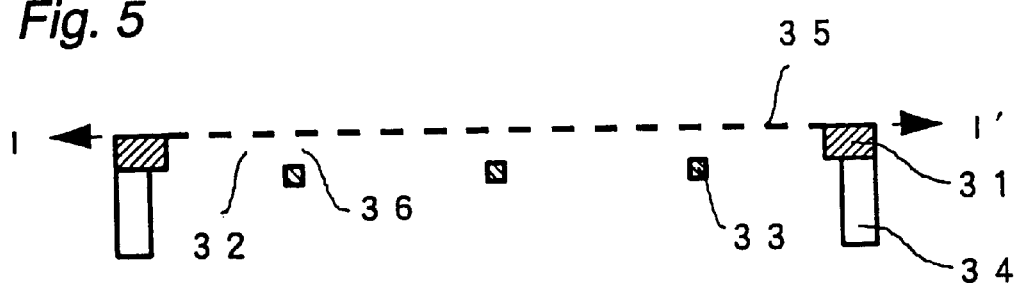
FIG. 5 is a sectional view along I–I' of FIG. 4.
Figure 6:
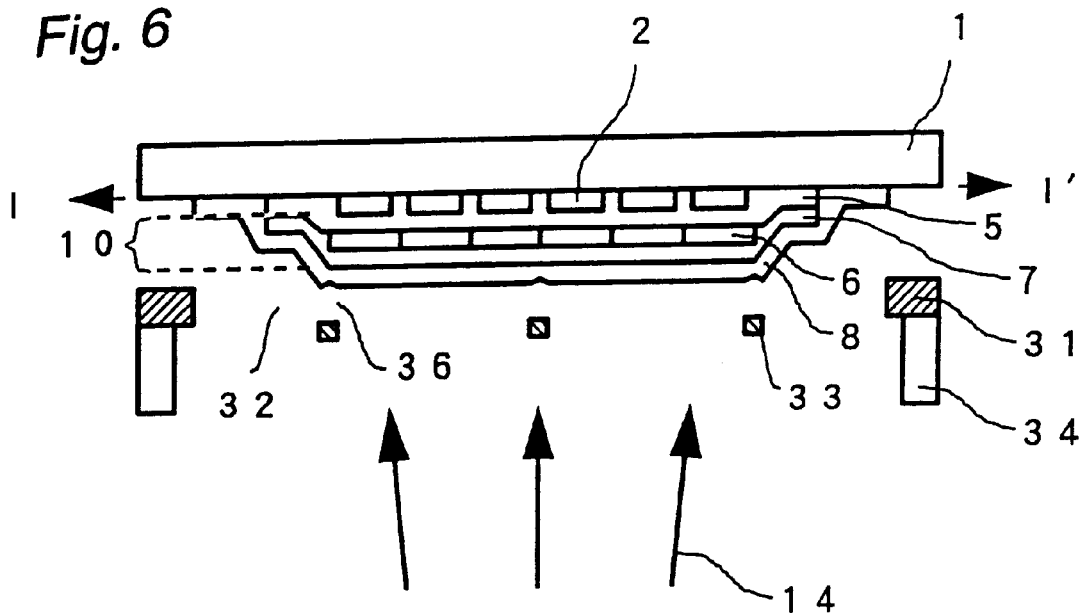
FIG. 6 is a sectional view along I–I' for illustrating an example of the second electrode patterning method in the present invention.
Figure 7:
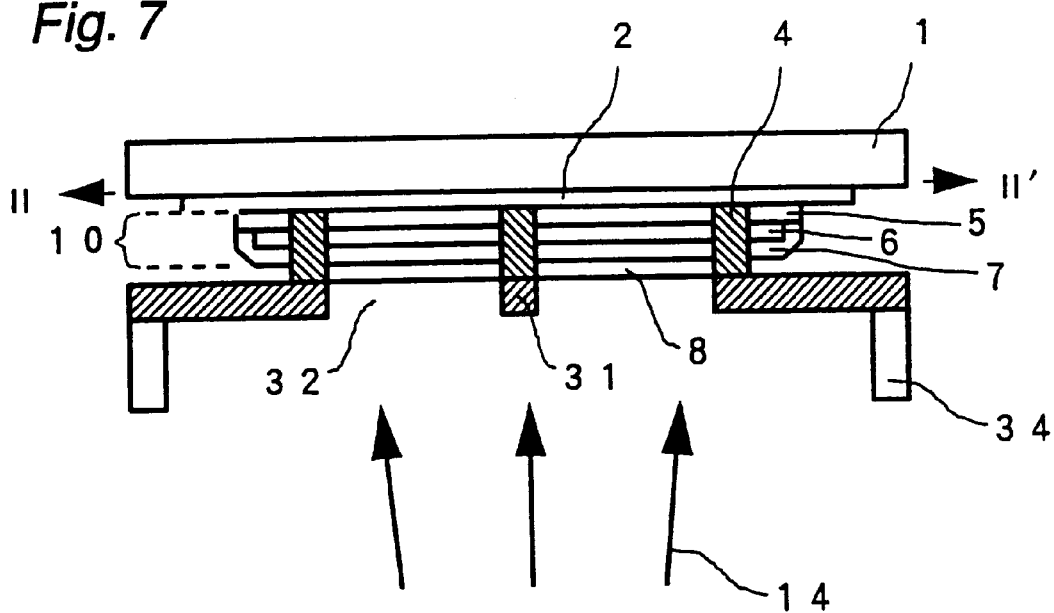
FIG. 7 is a sectional view along II–II' for illustrating an example of the second electrode patterning method in the present invention (side view of FIG. 6).

The production method of the present invention comprises the steps of forming spacers having a height at least partially exceeding the thickness of said thin film layer, and vapor-depositing a material for patterning while a shadow mask having reinforcing lines formed across its apertures is kept in contact with said spacers. For example, as shown in FIG. 3 which is a cross sectional view along II–II' of FIG. 1, spacers 4 having a height exceeding the thickness of a thin film layer 10 are formed on a substrate 1. After forming the thin film layer, etc., a shadow mask having reinforcing lines 33 as shown in FIG. 4 and FIG. 5 which is a sectional view along I–I' of FIG. 4 is kept in contact with the spacers, while a deposit is deposited for patterning second electrodes 8 as shown in FIG. 6 and FIG. 7 which is a side view of FIG. 6. In this case, since the shadow mask is kept in contact with the spacers, it can be prevented that the thin film layer is flawed. Furthermore, since a clearance 36 exists between one face 35 of the mask portion 31 of the shadow mask and the reinforcing lines, the deposit can be deposited behind the reinforcing lines using the clearance, for patterning without dividing the second electrodes by the reinforcing lines. In reference to this method for producing an organic electroluminescent device, the present invention is described below in detail.

Figure 8:
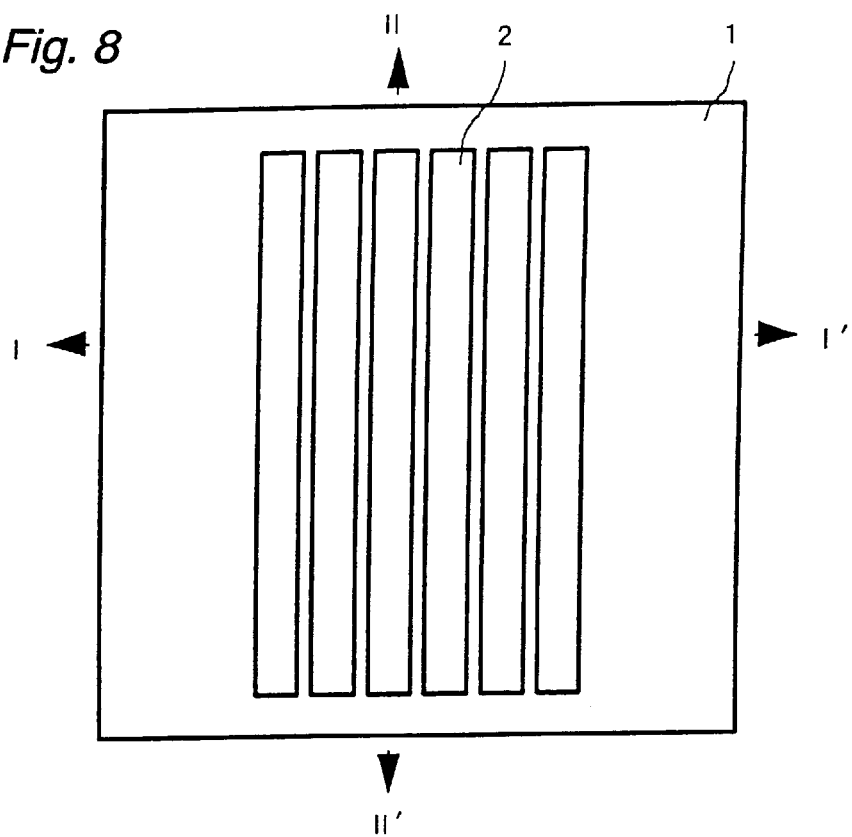
FIG. 8 is a plan view showing an example of the first electrode pattern.

At first, first electrodes 2 on a substrate 1 are patterned in form as shown in FIG. 8. The patterning method can be any publicly known technique, and is not especially limited. Therefore, the first electrodes can also be formed on the substrate by a patterning method of using a shadow mask having reinforcing lines of the present invention, but in general, the first electrode layer formed on the entire surface of a substrate can be patterned by photolithographic etching. The pattern of the first electrodes is not especially limited, and the optimum pattern suitable for the intended application can be selected. Furthermore, the patterning of first electrodes can be effected as required, and for example, if only one first electrode is used as a common electrode in a segment type electroluminescent device, the patterning of first electrodes is not required.

Figure 9:
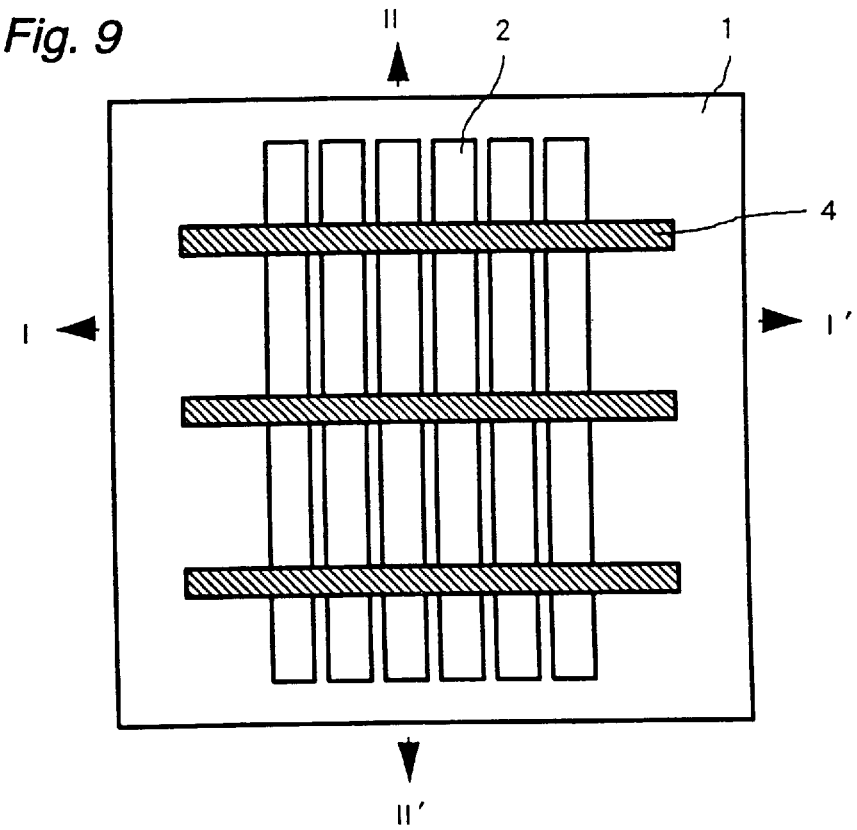
FIG. 9 is a plan view showing an example of the spacers formed in the present invention.

Then, as shown in FIG. 9, spacers 4 with a height exceeding the thickness of the thin film layer are formed to be positioned between the second electrodes to be formed later. In the production method of the present invention, it is necessary to form spacers with a height at least partially exceeding the thickness of the thin film layer on the substrate, for preventing that the shadow mask flaws the thin film layer formed on the substrate when the substrate and the shadow mask are kept in contact with each other. The height of the spacers is not especially limited, but considering the decline of pattern accuracy caused by the deposit straying into the clearance formed between the shadow mask and the substrate by the spacers, the height is usually in a range from 0.5 to 100 $\mu$m.

Figure 10:
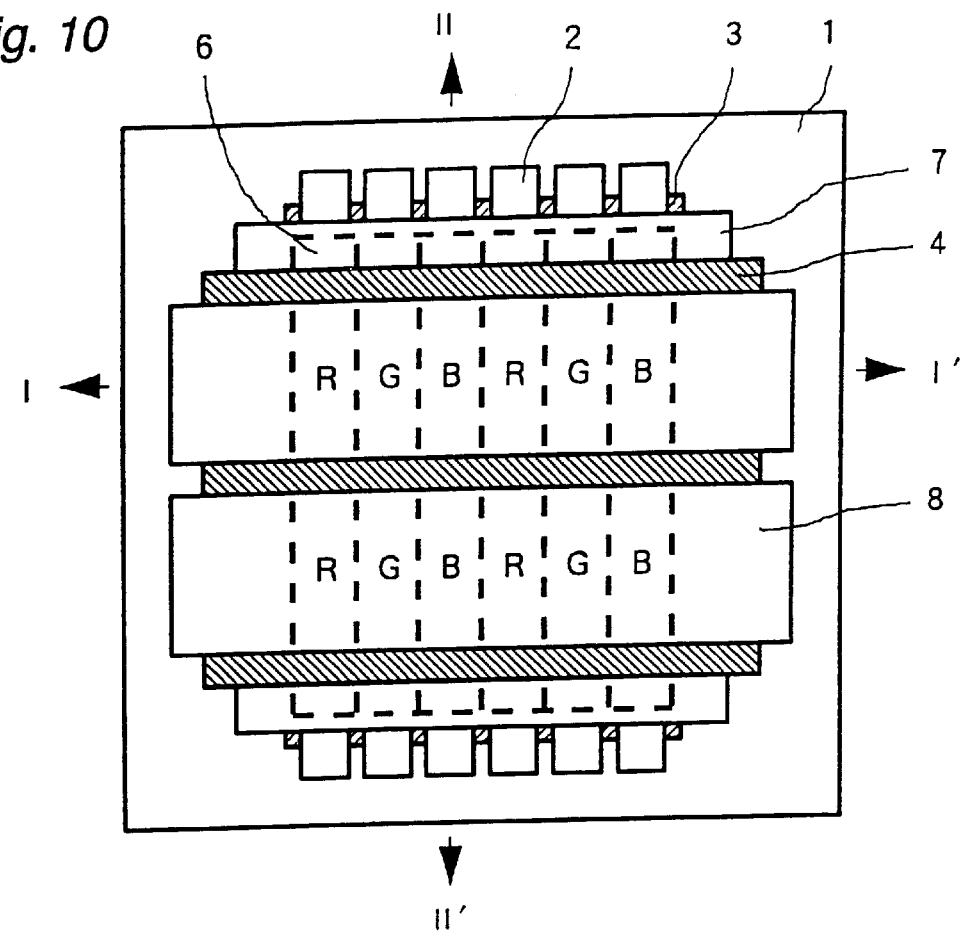
FIG. 10 is a plan view showing another example of the organic electroluminescent device produced according to the present invention.
Figure 11:
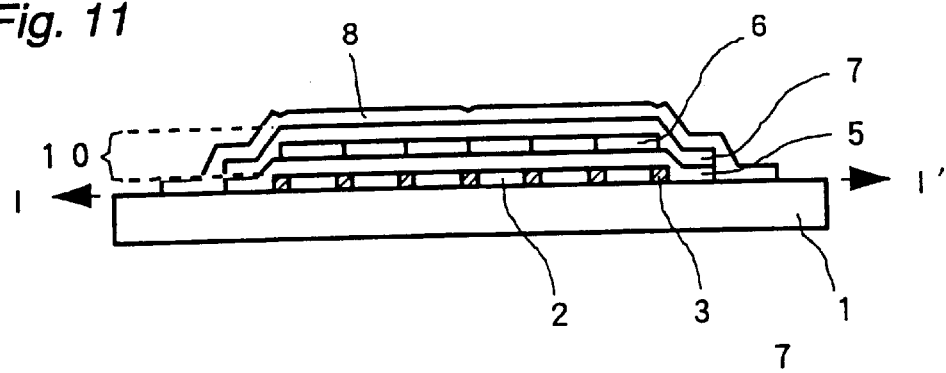
FIG. 11 is a sectional view along I–I' of FIG. 10.
Figure 12:
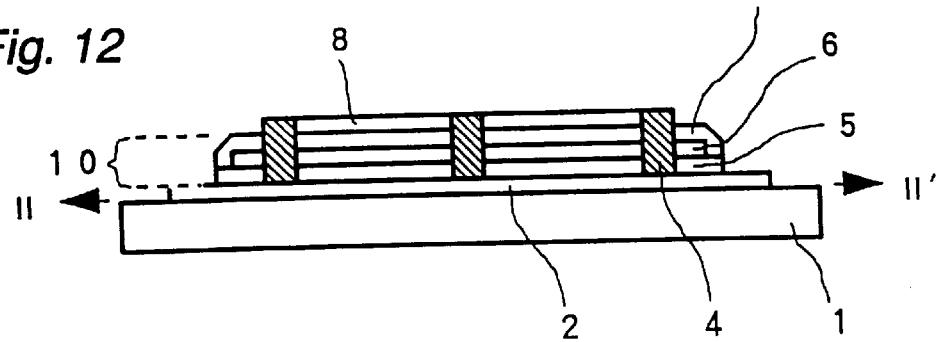
FIG. 12 is a sectional view along II–II' of FIG. 10.
Figure 13:
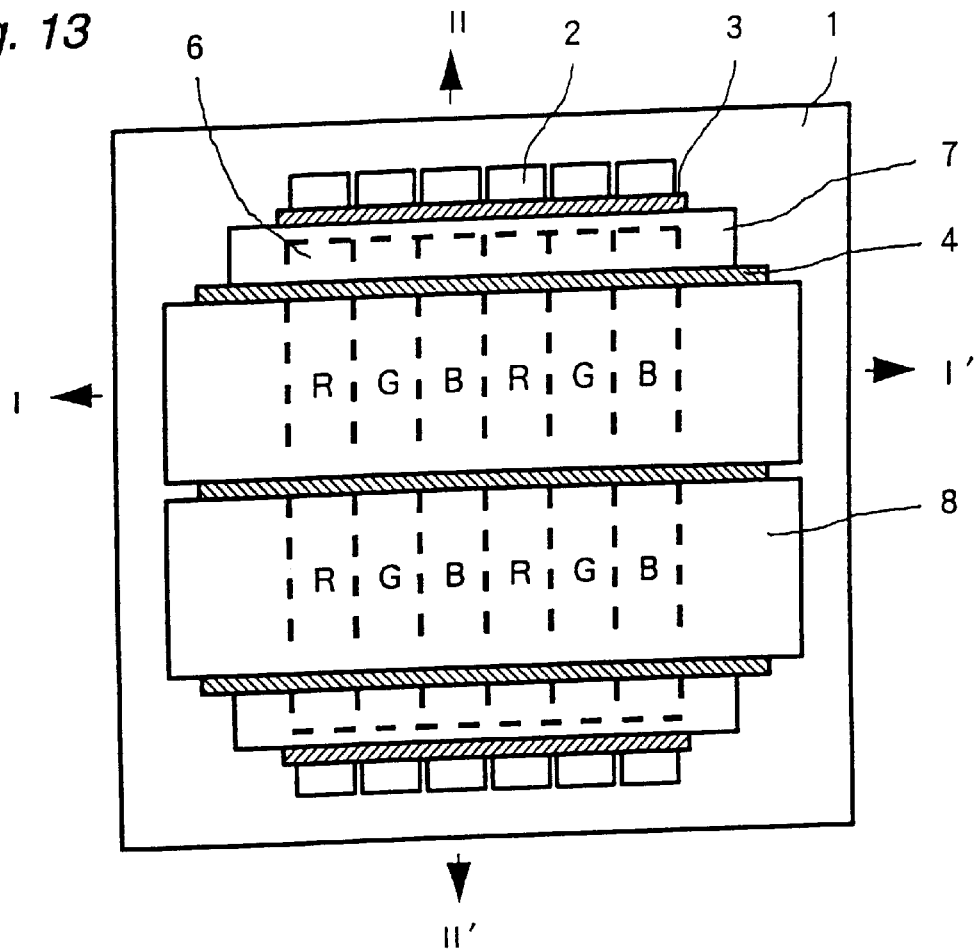
FIG. 13 is a plan view showing a further other example of the organic electroluminescent device produced according to the present invention.
Figure 14:
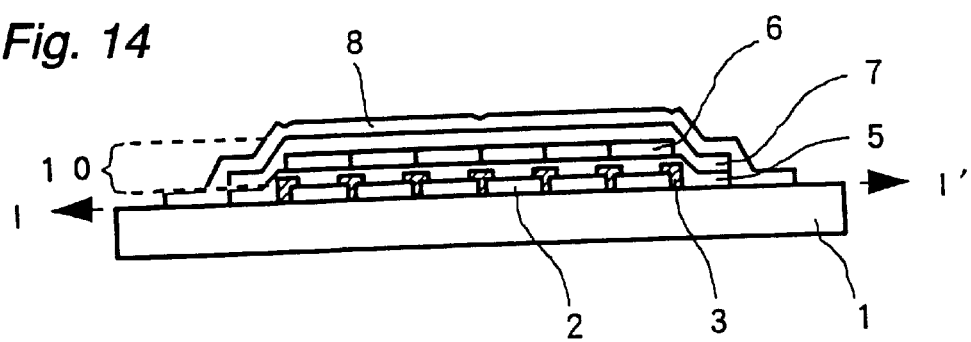
FIG. 14 is a sectional view along I–I' of FIG. 13.
Figure 15:
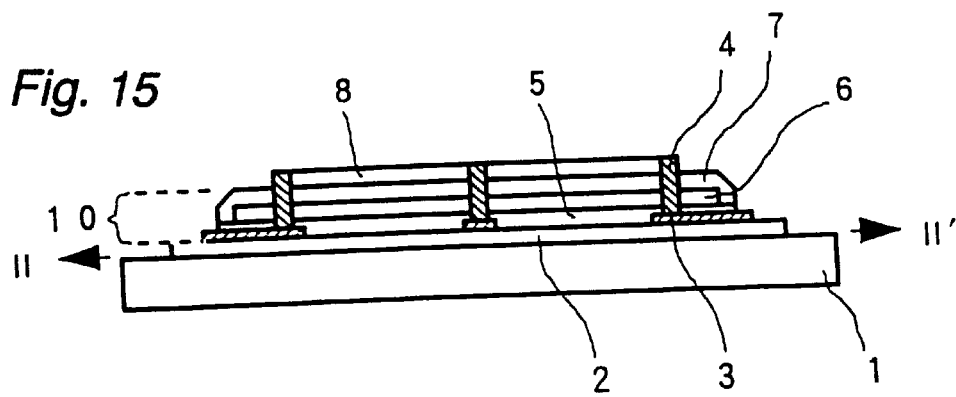
FIG. 15 is a sectional view along II–II' of FIG. 13.

The positions where the spacers are formed are not especially limited, but it is preferable to locate the spacers mainly in the non-luminescent regions in the organic electroluminescent device to minimize the loss of the emitting area. The spacers are not especially limited in structure and can be formed by one layer or a plurality of layers. For example, as shown in FIGS. 10 to 12, relatively thin first spacers 3 can be formed between the first electrodes 2, and second spacers 4 with a height exceeding the thickness of the thin film layer can be formed between the second electrodes 8 in the direction perpendicular to the first electrodes 2. Furthermore, the first spacers 3 can be formed so that they cover the ends of the first electrodes, to function as an inter-layer insulation layer, as shown in FIGS. 13 to 15. As a further other method, the first spacers can be formed as a matrix, and the second spacers 4 can be formed to partially overlap the first spacers. As a still further other method, a plurality of dot spacers can be arranged on the substrate. The spacers are not especially limited in sectional form.

Since the spacers are mostly formed in contact with the first electrodes, it is preferable that they have sufficient electric insulation performance. Conductive spacers can also be used, but in this case, electrically insulating portions are required to be formed for preventing the shortcircuiting between electrodes. For the spacers, publicly known materials can be used. Inorganic materials which can be preferably used as the spacers include oxide materials such as silicon oxide, glass materials, ceramic materials, etc., and organic materials which can be used include polymer resins such as polyvinyl resins, polyimide resins, polystyrene resins, acrylic resins, novolak resins and silicone resins. Furthermore, if the spacers are blackened wholly or at the portions in contact with the substrate or first electrodes, the spacers can have a black matrix function contributing to the improvement of display contrast. Spacer materials which can be preferably used in this case include inorganic materials such as silicon, gallium arsenide, manganese dioxide, titanium oxide and a laminate film of chromium oxide and metal chromium, and organic materials such as mixtures obtained by adding any of pigments and dyes based on carbon black, phthalocyanine, anthraquinone, monoazo, disazo, metal complex salt type monoazo, triallylmethane, aniline, etc. and treated on the surfaces to improve electric insulation performance, or any of powders of said inorganic materials, to any of said resins.

The method for forming the spacer layer is not especially limited, and can be a dry process such as resistance heating evaporation, electron beam evaporation or sputtering evaporation when an inorganic material is used, or can be a wet process such as spin coating, slit die coating or dip coating when an organic material is used.

The spacer patterning method is not especially limited, but in view of process, it is easy to form a spacer layer on the entire surface of the substrate after patterning the first electrodes, and then to use a publicly known photolithographic method for patterning. The spacers can also be patterned by etching or lifting off using a photoresist. Furthermore, a photosensitive spacer material obtained by making any of said resins photosensitive can be used to directly expose and develop the spacer layer for patterning.

Figure 16:
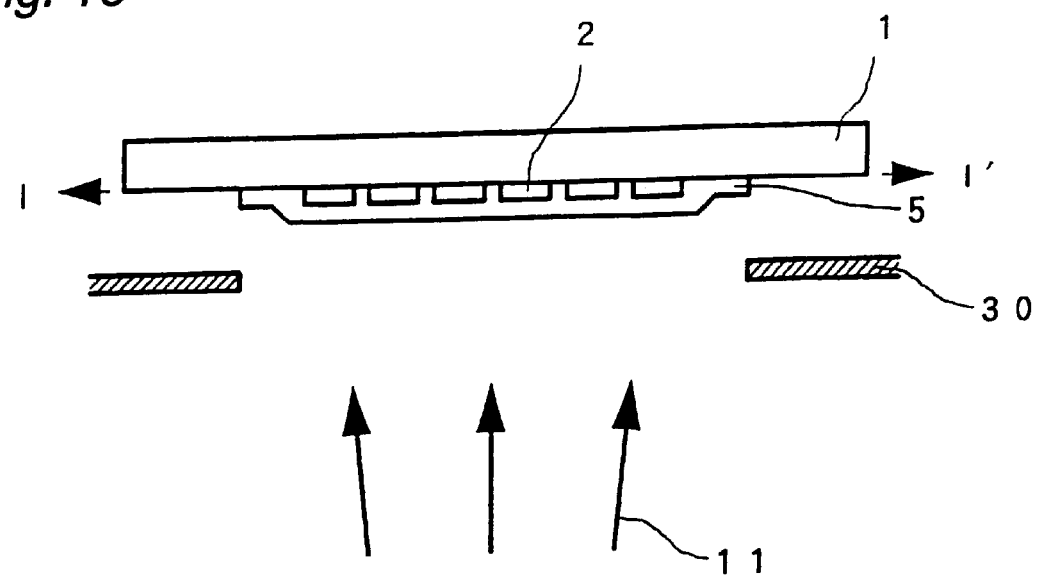
FIG. 16 is a sectional view along I–I' for illustrating a method for forming the hole transport layer.

The method for forming the thin film layer is described below. At first, a hole transport layer 5 is formed on the substrate with spacers formed on it as shown in FIG. 9. In this case, it is only required to vapor-deposit a hole transport material 11 in the entire area where luminescent regions exist as shown in FIG. 16.

Figure 17:
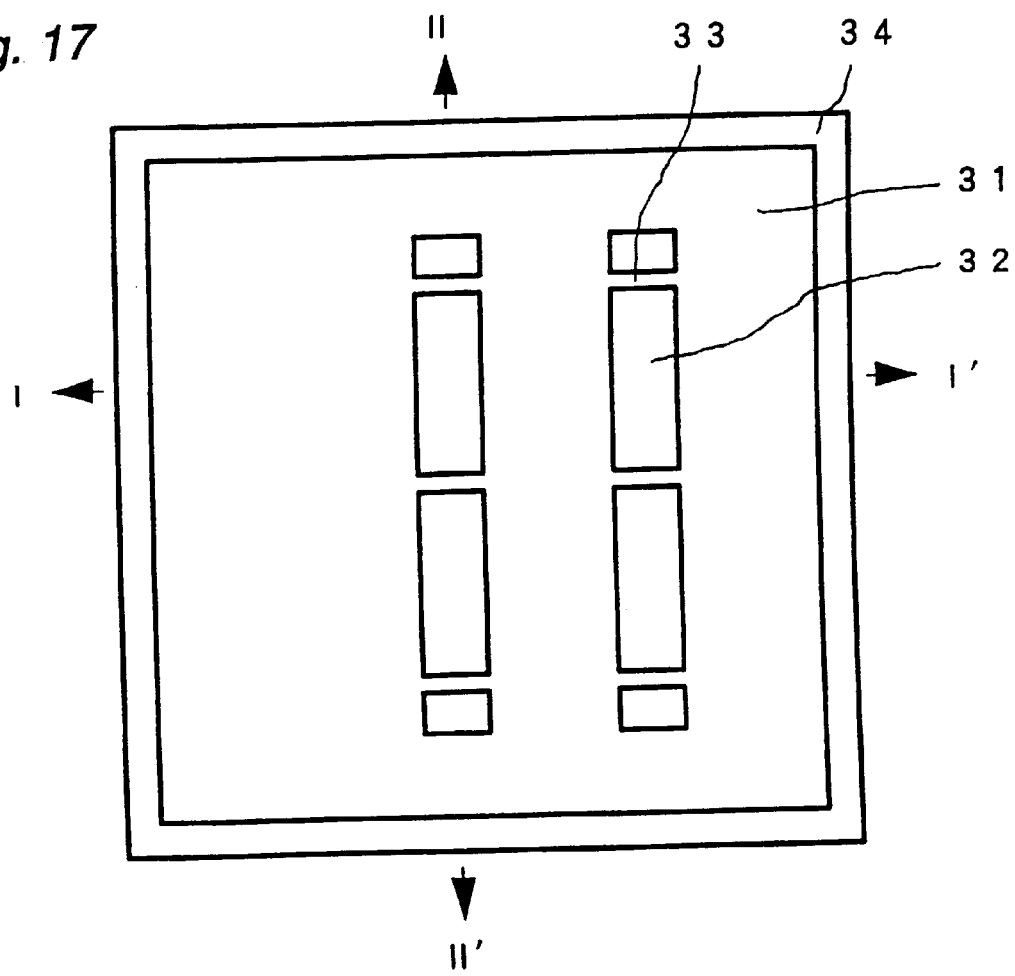
FIG. 17 is a plan view showing another example of the shadow mask used in the present invention.
Figure 18:
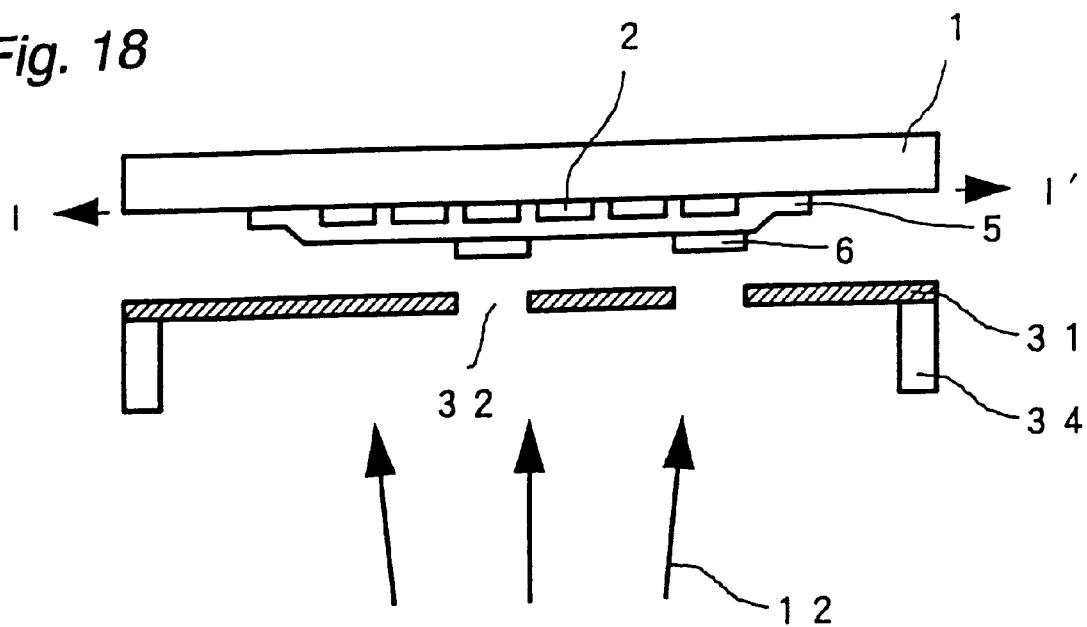
FIG. 18 is a sectional view along I–I' for illustrating an example of the emitting layer patterning method in the present invention.
Figure 19:
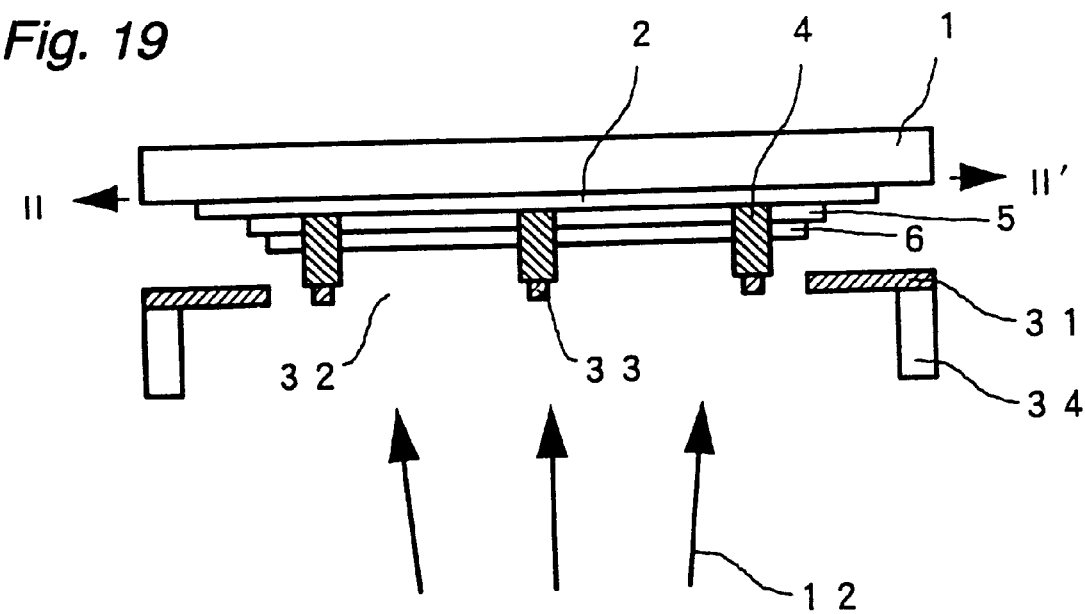
FIG. 19 is a sectional view along II–II' for illustrating an example of the emitting layer patterning method in the present invention (side view of FIG. 18).
Figure 20:
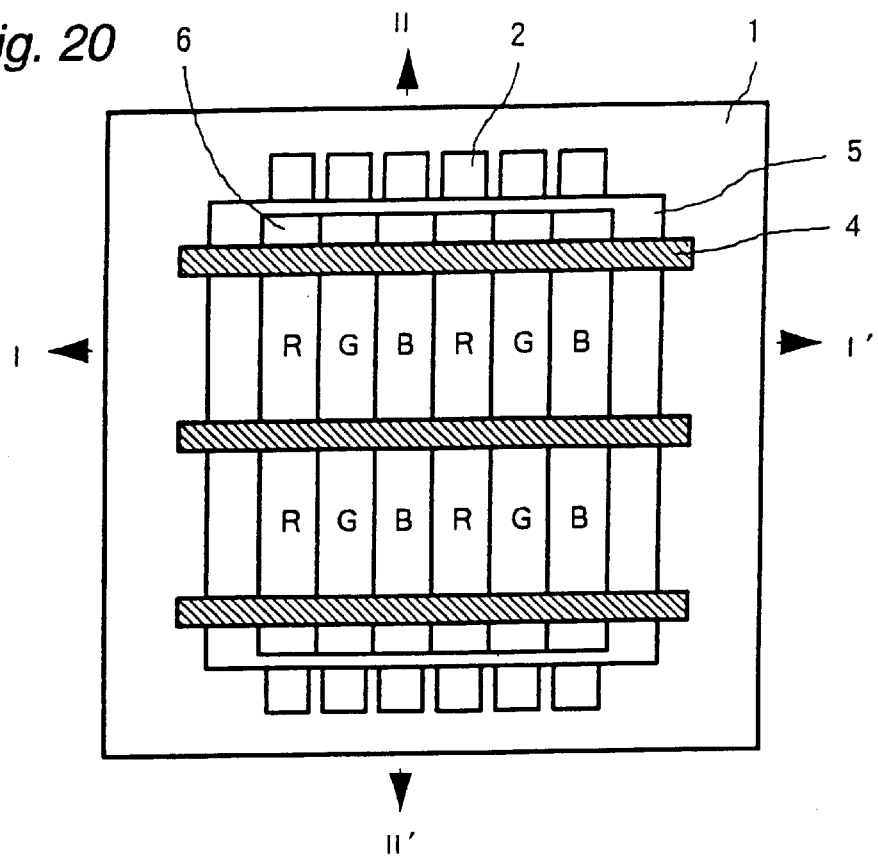
FIG. 20 is a plan view showing an example of the emitting layer patterned in the present invention.

The emitting layer is patterned as described below. The shadow mask used is shown in FIG. 17. The mask portion 31 has apertures 32 formed to correspond to the respective luminescent regions of the emitting layer, and to prevent the deformation of the apertures, reinforcing lines 33 are formed on the same plane as the mask portion, to cross the apertures for preventing the deformation of the apertures. Furthermore, the shadow mask is fixed on a frame 34 to allow easy handling. Then as shown in FIG. 18 and FIG. 19 which is a side view of FIG. 18, the shadow mask is brought into contact with the spacers 4, while relatively positioning the first electrodes 2 and the apertures 32 to ensure that the spacers 4 overlie on the reinforcing lines 33. That is, the reinforcing lines are kept in contact with the spacers. If a luminescent material 12 is vapor-deposited in this state, a emitting layer 6 (B regions of the emitting layer, in this case) is formed on desired regions. This action is repeated three times, for patterning the respective R, G and B regions of the luminescence layer 6 over the first electrodes as shown in FIG. 20. The shadow mask used for patterning the emitting layer is not limited to the mask shown in FIG. 17. For example, the shadow mask used for patterning the second electrodes shown in FIG. 4, etc. can also be used for patterning.

Since the shadow mask contacts the spacers without flawing the thin film layer, it does not happen that the properties of the organic electroluminescent elements are degraded, and furthermore, the substrate and the shadow mask can be easily relatively positioned.

The emitting layer can be patterned by using shadow masks as many as the number of colors of the emitting layer, but when the same luminescence pattern is repetitively formed as in a matrix type electroluminescent device, the respective color regions of the emitting layer can be patterned by shifting the relative positions of one shadow mask and the substrate.

The shadow mask is not especially limited in structure. However, it is preferable that the reinforcing lines are arranged at the apertures to ensure that the reinforcing lines agree with the high portions of the spacers exceeding the thickness of the thin film layer for avoiding that any portions behind the reinforcing lines exist in the luminescent regions.

The reinforcing lines are not especially limited in width, but it is preferable that the width is smaller than the width of the portions where no emitting layer exists, i.e., the non-luminescent regions in the organic electroluminescent device. Therefore, it is preferable that the width of reinforcing lines is smaller than 50 $\mu$m. Smaller than 30 $\mu$m is more preferable. In view of the form integrity of the shadow mask, it is desirable that the thickness of the mask portion is larger, but to keep the width of reinforcing lines smaller, it is preferable that the thickness is more than about one half to less than about 3 times the width of reinforcing lines.

The plane sizes of the first electrodes and the luminescent regions of the emitting layer are not especially limited, but for decreasing the possibility of the shortcircuiting between the first electrodes and the second electrodes, it is preferable that the luminescent regions of the emitting layer are larger than the exposed portions of the first electrodes corresponding to the respective luminescent regions. In the passive matrix type electroluminescent device shown in FIGS. 1 to 3, the practical typical crosswise pitch of respective luminescent regions can be, for example, 100 $\mu$m. In this case, if the width of each first electrode is 70 $\mu$m, it is preferable to set the widths of each luminescent region of the emitting layer and each aperture at values close to 100 $\mu$m equal to the pitch, to ensure that the widths of the luminescent region and the aperture are larger than the width of the first electrode and that the luminescent region and the aperture do not overlap the adjacent first electrodes.

To produce a monochromatic electroluminescent device, the patterning of the emitting layer can be omitted. In this case, as in the method shown in FIG. 16, the emitting layer can be formed by depositing a luminescent material in the entire area where the luminescent regions exist.

Figure 21:
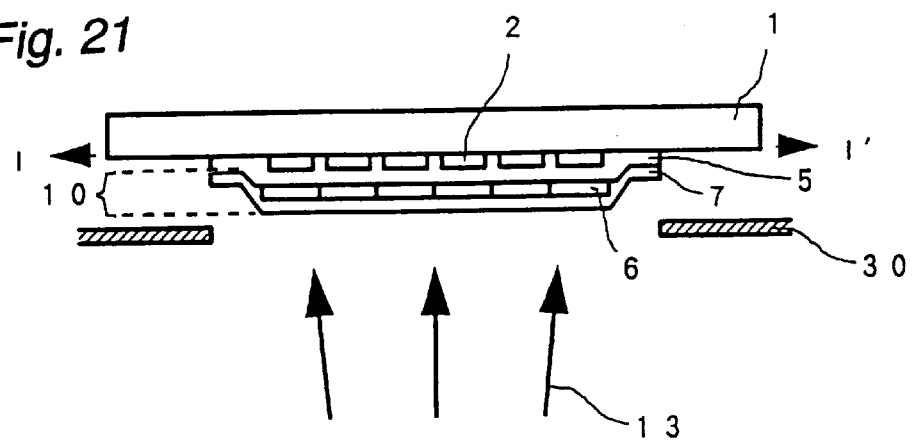
FIG. 21 is a sectional view along I–I' for illustrating a method for forming the electron transport layer.
Figure 22:
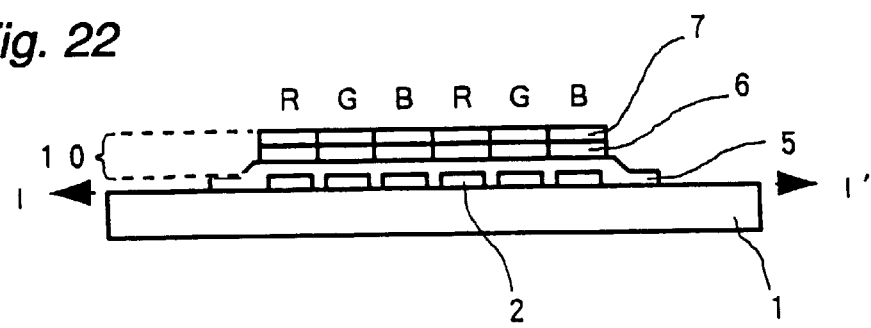
FIG. 22 is a sectional view along I–I' showing another example of the electron transport layer patterned in the present invention.

For the electron transport layer, an electron transport material 13 is deposited on the entire area where the luminescent regions exist, to form the electron transport layer 7, as shown in FIG. 21. Furthermore, if an electron transport material is deposited continuously in the step of patterning the emitting layer shown in FIGS. 18 and 19, the electron transport layer 7 can also be patterned to correspond to the respective R, G and B regions of the emitting layer 6 as shown in FIG. 22. The method for forming the electron transport layer is not especially limited. However, even if any region where no emitting layer exists on any first electrode for example since a foreign matter is deposited on the shadow mask, the electron transport material deposited on the entire area allows the region to be covered with an electron transport layer, for effectively preventing that the organic electroluminescent element from being greatly degraded in properties. So, it is preferable to form the electron transport layer by the former method. In this case, to prevent the change of lu,inescent colors due to the migration of energy from the emitting layer to the electron transport layer, it is preferable to use an electron transport material with a luminescence energy equivalent to or larger than the largest luminescence energy among those of the respective color regions of the emitting layer. That is, in the structure of the electroluminescent device shown in FIG. 21, it is preferable to use an electron transport material with a luminescence energy equivalent to or larger than that of the B regions of the emitting layer, for forming the electron transport layer 7.

The above step of forming the hole transport layer or electron transport layer can be omitted, depending on the structure of the thin film layer contained in the organic electroluminescent element.

The method for patterning the second electrodes is described below. The shadow mask used is shown in FIGS. 4 and 5. The mask portion 31 is provided with apertures 32 formed to correspond to the second electrodes, and to prevent the deformation of the apertures, reinforcing lines 33 exist across the apertures. Furthermore, between one face 35 of the mask portion and the reinforcing lines, a clearance 36 exists. Moreover, the shadow mask is fixed on a frame 34 to allow easy handling. Then, the shadow mask is brought into contact with the spacers 4 by positioning to ensure that the spacers 4 overlie on the mask portion 31. If a second electrode material 14 is vapor-deposited in this state, the second electrodes 8 are formed at desired regions. The second electrode material flying from the reinforcing lines 33 goes into the portions behind the reinforcing lines because of the clearance 36, and it does not happen that the second electrodes are divided by the reinforcing lines.

Since the shadow mask contacts the spacers, without flawing the thin film layer, the properties of the organic electroluminescent elements are not degraded, and the substrate and the shadow mask can be easily relatively positioned.

It is preferable to pattern the second electrodes by one step of vapor deposition as described above. However, the number of steps is not especially limited. The second electrodes can also be patterned by a plurality of vapor deposition steps by using a plurality of shadow masks or by relatively shifting one shadow mask and the substrate in position.

The vapor deposition conditions of the second electrode material are not especially limited. Vapor deposition from one evaporation source can be adopted, but to make the second electrodes less likely to be divided by reinforcing lines, it is effective to evaporate the second electrode material in a plurality of different directions in reference to the reinforcing lines, for ensuring that the second electrode material goes behind the reinforcing lines. For manifesting such an effect, when a high vacuum process such as vacuum evaporation in which the deposit is emitted straight from one or more evaporation sources to the substrate is used, it is preferable in view of process to evaporate the second electrode material from a plurality of evaporation sources or to move or rotate the substrate relatively to one or more evaporation sources for depositing the second electrode material. Furthermore, a low vacuum process such as sputtering evaporation is preferable since the second electrode material is likely to deposit behind the reinforcing lines by flying in random directions.

The positional relation between the spacers and the mask portion of the shadow mask is not especially limited. However, it is preferable that the high portions of the spacers exceeding the thickness of the thin film layer exist above the mask portion of the shadow mask, i.e., between the second electrodes as shown in FIG. 7, for such reasons that since the clearance between the substrate and the reinforcing lines becomes effectively large, the amount of the second electrode material going behind the reinforcing lines increases, to deposit the second electrode material in the relatively less rough regions of the substrate, for inhibiting the increase of the electric resistance of the second electrodes, and that depending on conditions, since the thin film layer is perfrectly covered by the first electrodes or substrate, spacers and second electrodes, the degradation of the properties of the organic electroluminescent elements due to the penetration of water into the thin film layer, etc. can be inhibited.

Figure 23:
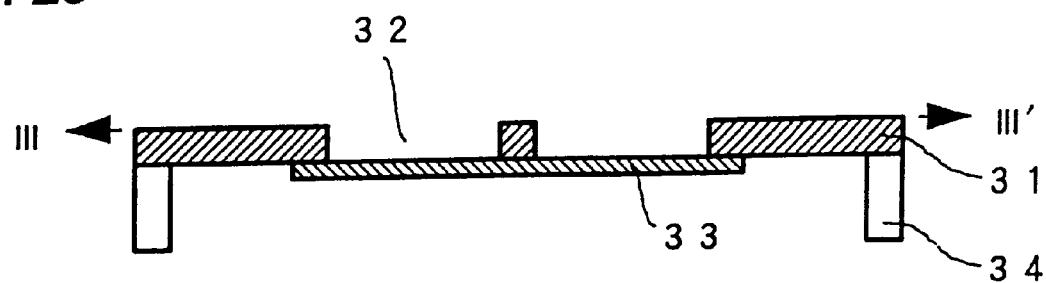
FIG. 23 is a sectional view along III–III' of FIG. 4.
Figure 24:
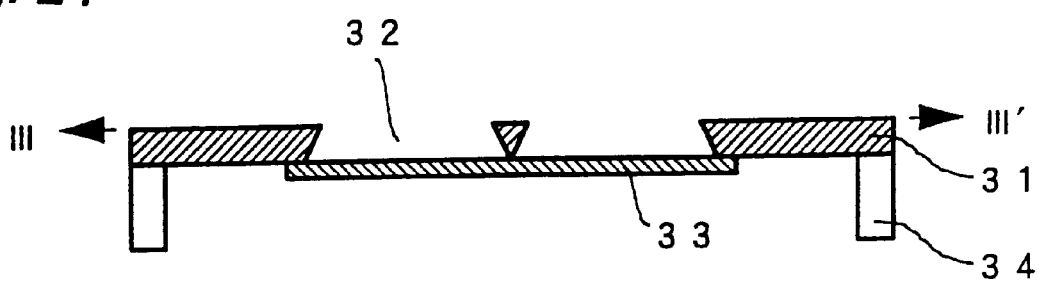
FIG. 24 is a sectional view along III–III' showing a further other example of the shadow mask used in the present invention.
Figure 25:
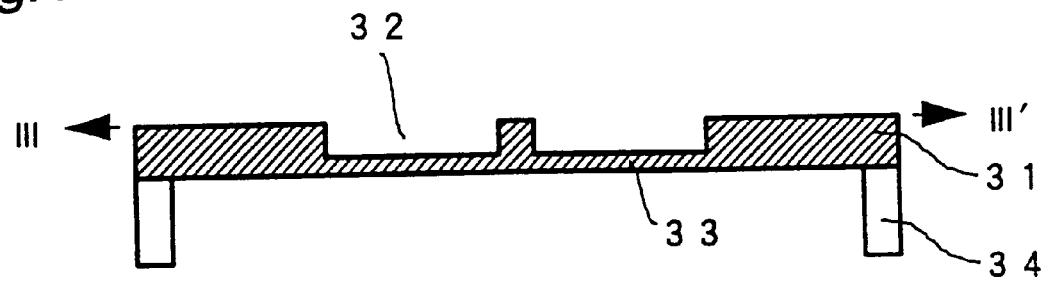
FIG. 25 is a sectional view along III–III' showing a still further other example of the shadow mask used in the present invention.

The shadow mask used for patterning the second electrodes is not limited to the structure shown in FIG. 4 or FIG. 23, and for example, the reinforcing lines can also be arranged to form meshes. Furthermore, as shown in the sectional view of FIG. 24, the mask portion 31 may be tapered, or as shown in the sectional view of FIG. 25, the reinforcing lines 33 can also be structurally integrated with the mask portion 31.

The thickness of the mask portion is not especially limited since the clearance between one face of the mask portion and the reinforcing lines becomes larger when the thickness is larger, the amount of the deposit which goes behind the reinforcing lines increases. However, since it is difficult to accurately produce a shadow mask with a large thickness compared to the width of the mask portion, it is preferable that the thickness of the mask portion is almost equal to the minimum width of the mask portion to less than about three times. It is preferable that the width of the reinforcing lines is less than the height of the clearance since thinner reinforcing lines allows more of the deposit to go behind the reinforcing lines basically. It is preferable that the number of reinforcing lines is as small as possible within a range to sufficiently prevent the deformation of apertures, for lessening the portions remaining behind the reinforcing lines.

As required, after the second electrode patterning step, a passivation layer can be formed or the luminescence regions can be sealed by using a publicly known technique or the patterning technique in the production method of the present invention.

Figure 26:
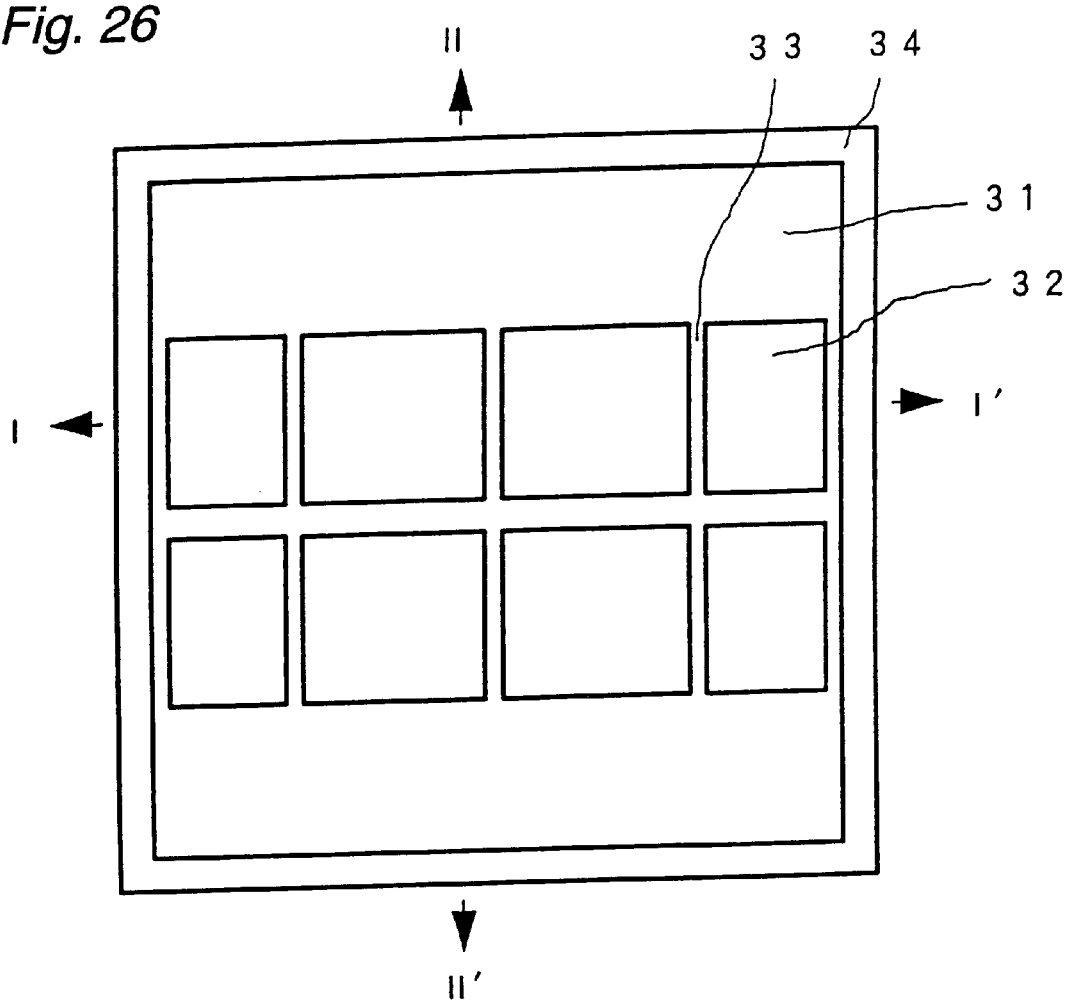
FIG. 26 is a plan view showing a still further other example of the shadow mask used in the present invention.
Figure 27:
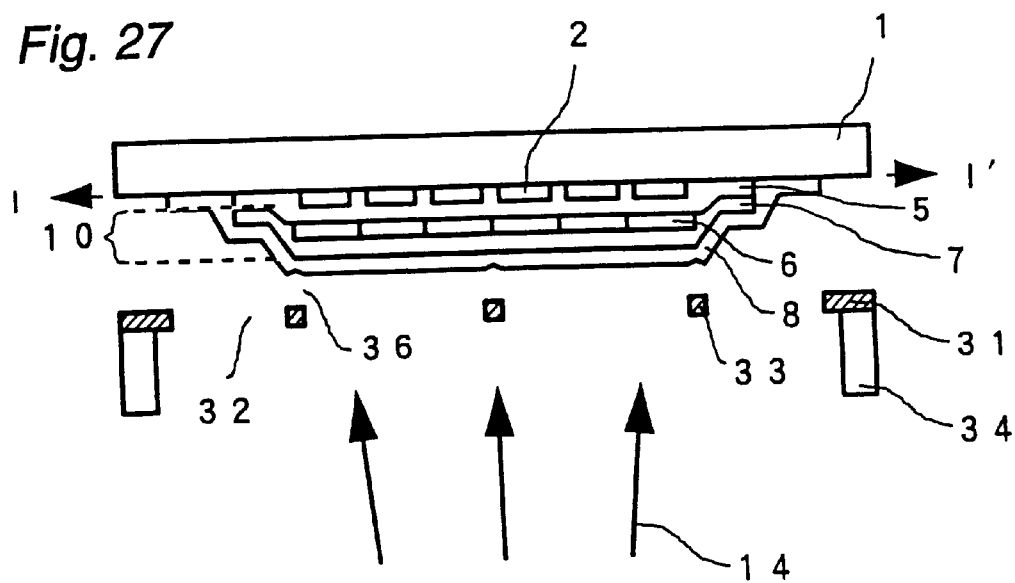
FIG. 27 is a sectional view along I–I' showing another example of the second electrode patterning method in the present invention.
Figure 28:
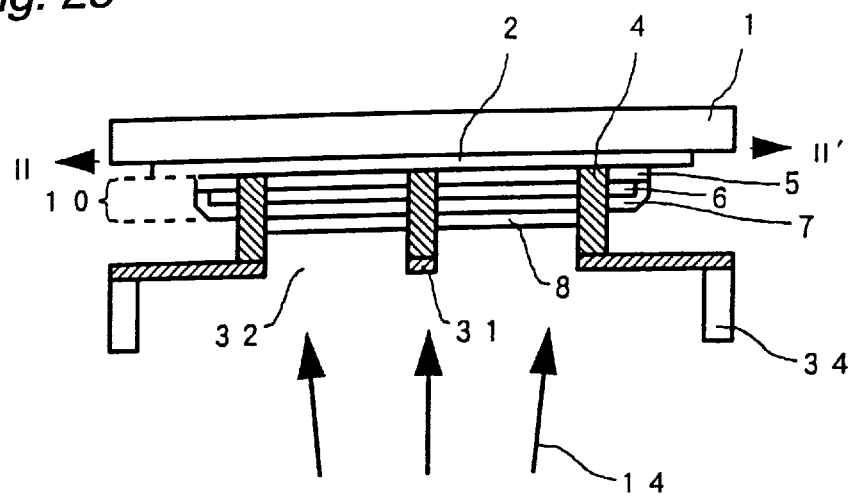
FIG. 28 is a sectional view along II–II' for illustrating another example of the second electrode patterning method in the present invention (side view of FIG. 27).

It is preferable to pattern at least either the emitting layer or the second electrodes of the organic electroluminescent device in the production method of the present invention, but the present invention does not limit the structure of the shadow mask used for patterning. Therefore, for example, a shadow mask with a structure shown in FIG. 4 in which the reinforcing lines do not contact the spacers can be used to pattern the emitting layer while the second electrodes are patterned by a publicly known technique. Furthermore, a shadow mask in which the reinforcing lines 33 and the mask portion 31 are formed on the same plane as shown in FIG. 26 can also be used, and as shown in FIG. 27 and FIG. 28 which is a side view of FIG. 27, the spacers 4 can be formed to be relatively higher, to pattern the second electrodes 8 by using the clearance 36 formed between the reinforcing lines 33 and the thin film layer 10.

Figure 29:
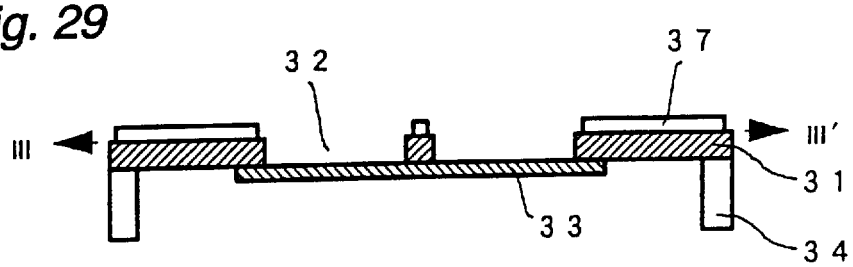
FIG. 29 is a sectional view along III–III' showing an example of the shadow mask with cushion portions used in the present invention.

The preferable materials which can be used for the shadow mask include, though not limited to, metals such as stainless steel, copper alloys, nickel alloys and aluminum alloys, and photosensitive resins prepared by making photosensitive publicly know resins such as polyvinyl resins, polyimide resins, polystyrene resins, acrylic resins, novolak resins and silicone resins. The material of the mask portion of the shadow mask can be the same or different form the material of the reinforcing lines. Furthermore, if relatively highly flexible cushion portions 37 made of any of said resins are formed on the shadow mask on the side kept in contact with the spacers as shown in FIG. 29, the effect of preventing the damage to the spacers and the thin film layer when both are kept in contact with each other can be further improved.

In the production method of the present invention, it is preferable that the shadow mask uses a magnetic material as at least either the mask portion or the reinforcing lines, to be kept in contact with the spacers by magnetic force. In this case, the substrate can be more uniformly and reliably kept in contact with the shadow mask, to improve the patterning accuracy. The method for fixing the relative position of the substrate and the shadow mask after positioning and the method for supporting the weight of the shadow mask are not especially limited, and either magnetic force or mechanical method can be used.

The preferable magnetic materials which can be used as at least either the mask portion or the reinforcing lines include metals such as iron alloys, cobalt alloys and nickel alloys, magnetic materials such as carbon steel, tungsten steel, chromium steel, cobalt steel, KS steel, MK steel, Alnico steel, NKS steel, Cunico steel, OP ferrite and Ba ferrite, rare earth element magnetic materials such as Sm—Co based materials and Nd-Fe-B based materials, core materials such as silicon steel sheet, Al—Fe alloy, Mn—Zn ferrite, Ni—Zn ferrite and Cu—Zn ferrite, and dust core materials produced by compressively molding a fine powder of carbonyl iron, Mo Permalloy or Sendust together with a binder. It is preferable to prepare the shadow mask from a magnetic material sheet, but the shadow mask can also be produced from a sheet of a mixture consisting of a rubber or resin and a powder of any of said magnetic materials. Furthermore, as required, the shadow mask can also be produced from an already magnetized material, or a shadow mask produced can also be magnetized.

As for the method for keeping the shadow mask in contact with the spacers by magnetic force, it is preferable to attract the shadow mask made by using a magnetic material as at least either the mask portion or the reinforcing lines, by a magnet located on the back side of the substrate of the organic electroluminescent device. However, since it is only required that the shadow mask and one or more other objects attract each other by magnetic force, the method is not limited to the above. For example, a shadow mask functioning as a magnet and a substrate made of a magnetic material can be combined to let attractive force act between them, for improving the adhesion between them.

The magnet can be any publicly known permanent magnet or electromagnet. It is not especially limited in form or size. Furthermore, while the shadow mask can be attracted using one magnet, a plurality of magnets can be bonded together or arranged side by side at predetermined intervals, to be used as a set. The distance between the magnet and the shadow mask and the magnitude of the magnetic force acting between both are not especially limited as far as a sufficient magnetic force acts on the shadow mask.

The method for producing the shadow mask is not especially limited, and any of mechanical grinding, sand blasting, sintering, laser processing, etc. can be used. However, the use of etching, electroforming or photolisography excellent in processing accuracy is preferable. Above all, electroforming is an especially preferable shadow mask producing method since the mask portion can be formed to be thick relatively easily.

In the production of the shadow mask, the mask portion and the reinforcing lines can be formed by one step, but the shadow mask can also be produced by forming the mask portion and the reinforcing lines respectively separately and overlapping them for connection. In this case, both can be connected by any method such as bonding, pressure bonding or welding, or if either of them is electrically conductive, they can be connected by electrodeposition. That is, the mask portion and the reinforcing lines kept in contact with each other are immersed in an electrolyte and energized to precipitate an electrodeposit at the contact portions between them, for connecting them. In general, as the electrodeposit, a metal such as nickel is selected, but an organic material such as polyaniline can also be used. The shadow mask can also be produced by forming a photosensitive resin layer on a pre-formed mask portion, and patterning the photosensitive resin layer by photolithography.

It is preferable that the shadow mask used in the production method of the present invention has high flatness, to be uniformly kept in contact with the spacers on the entire surface of the substrate. However, since the shadow mask with a fine and highly precise pattern is not so strong, it often occurs that the shadow mask becomes less flat during the production of the shadow mask. In this case, the flatness of the shadow mask can be improved by using such a method as annealing. Furthermore, in view of handling convenience, the shadow mask is often fixed on a frame when used, and in this case, its flatness can be improved by fixing the shadow mask on the frame while tensioning or heating it.

Moreover, as described before, it is basically preferable that the width of the reinforcing lines is smaller, but the handling of the shadow mask during the production of the shadow mask becomes difficult by that. Therefore, a shadow mask having reinforcing lines which has a relatively larger width can be produced, to narrow the reinforcing lines to a desired width later. In view of process, the line narrowing by etching is easy, but the method of line narrowing is not especially limited. Any proper method can be used to suit the material of the shadow mask.

The present invention is described below based on examples.

Reference Example

The methods for producing the shadow masks used in the following examples are described below.

Figure 35:
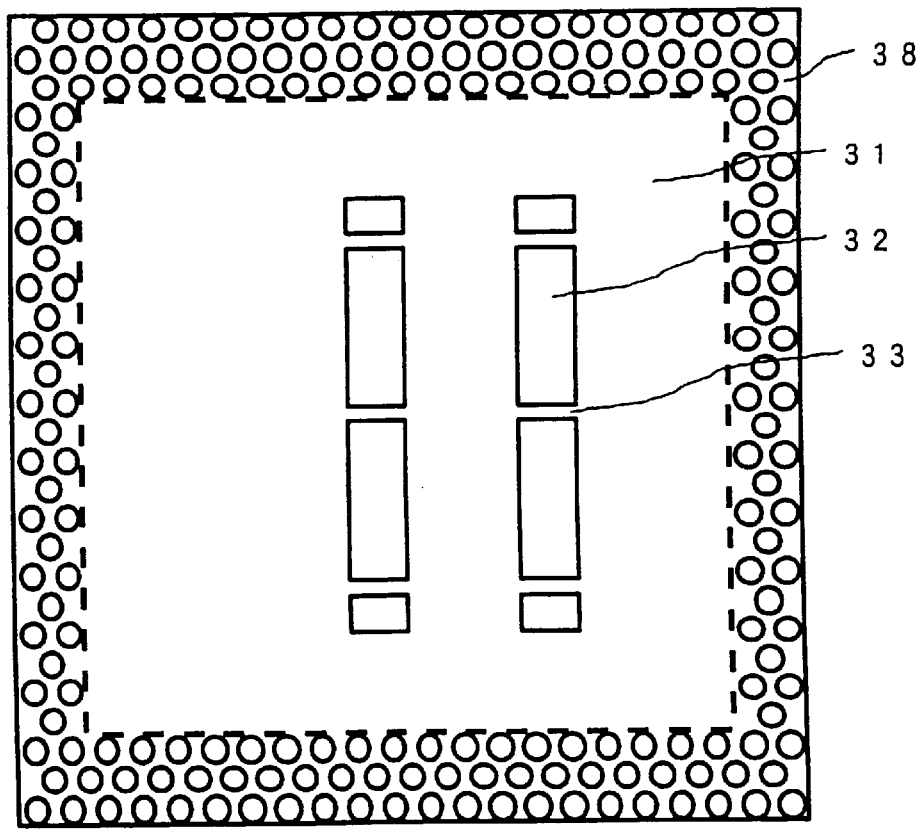
FIG. 35 is a plan view for illustrating the method for producing the shadow mask for emitting layer patterning used in the examples.

The method for producing the shadow mask for the emitting layer is described below. At first, Ni—Co alloy was precipitated on a mother substrate by electroforming, to form a sheet with a margin of meshes 38 connected around a mask portion 31 as shown in FIG. 35. Then, while the sheet was tensioned by using the margin of meshes, the mask portion was overlaid on a frame, and both were fastened using an adhesive. Finally, the margin of meshes extending beyond the frame was cut off, to produce a shadow mask with high flatness for the emitting layer.

Figure 36:
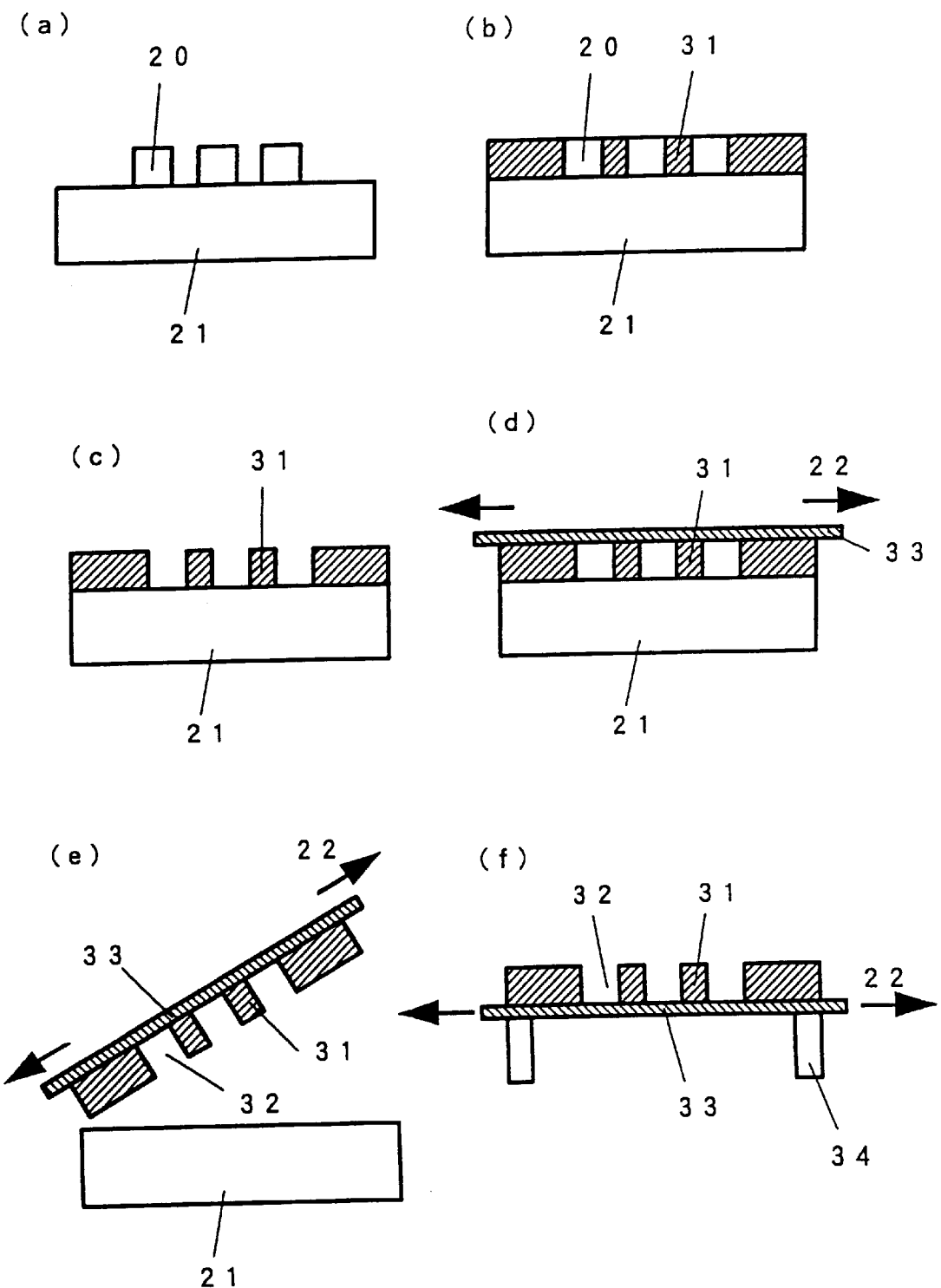
FIG. 36 is sectional views for illustrating the method for producing the shadow mask for second electrode patterning used in the examples.
Figure 37:
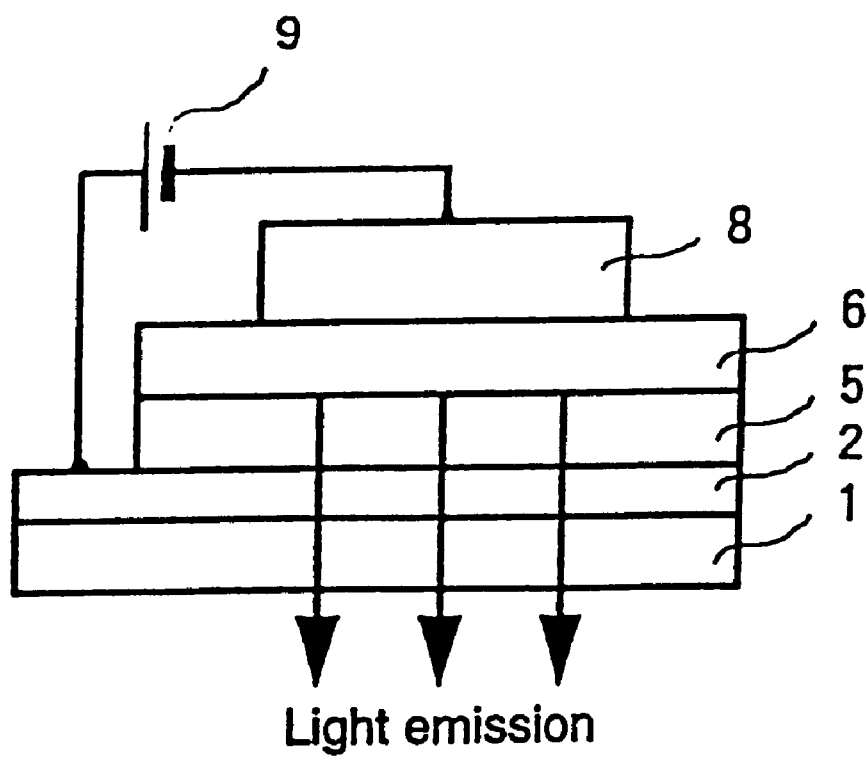
FIG. 37 is a sectional view showing an example of the conventional organic electroluminescent element.

The method for producing the shadow mask for the second electrodes is described below in reference to FIG. 36. Beforehand, Ni had been precipitated on a mother substrate by electroforming, to form reinforcing lines of meshes. At first, (a) on the mother substrate 21 with a pattern of photoresist 20, (b) Ni—Co alloy was precipitated to form a mask portion 31, and then (c) the photoresist only was removed. Subsequently (d) reinforcing lines 33 were overlapped on the mask portion with tension 22 applied to the reinforcing lines, and Ni was precipitated at the contact portions of both by electrodeposition, to connect both. Furthermore, (e) with the tension kept, the connected mask portion and reinforcing lines were removed, and (f) and the mask portion was overlaid on a frame 34, both being fixed using an adhesive. Finally, the portions of the reinforcing lines extending beyond the frame were cut off, to produce a shadow mask with high flatness for the second electrodes.

EXAMPLE 1

Shadow masks with a structure in which the mask portion and the reinforcing lines were formed on the same plane as shown in FIG. 17 were prepared for patterning the emitting layer. Each of the shadow masks was 120×84 mm in outside form and 25 $\mu$m in the thickness of the mask portion 31, and had ninety two 64 mm long 305 $\mu$m wide apertures 32 formed in stripes at a pitch of 900 $\mu$m in the crosswise direction. At the apertures formed in stripes, 20 $\mu$m wide and 25 $\mu$m thick reinforcing lines 33 across the apertures were formed at 1.8 mm intervals. Furthermore, the shadow mask was fixed on a 4 mm wide stainless steel frame 34 equal in outside form to the shadow mask.

Figure 30:
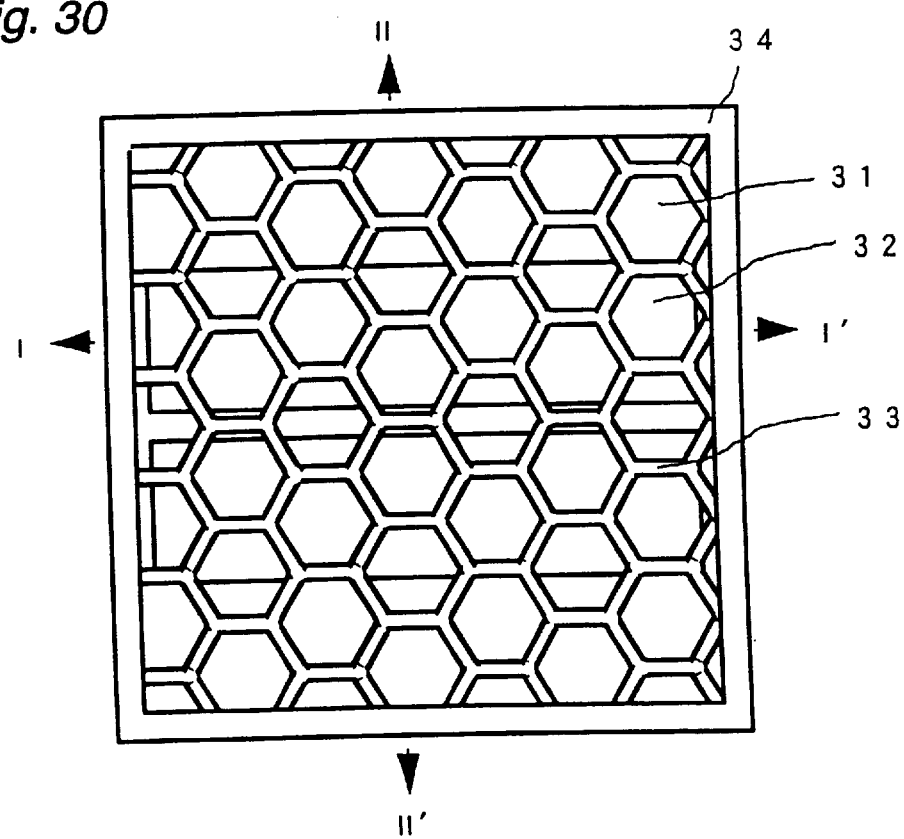
FIG. 30 is a plan view showing the shadow mask for second electrode patterning used in Example 1.
Figure 31:
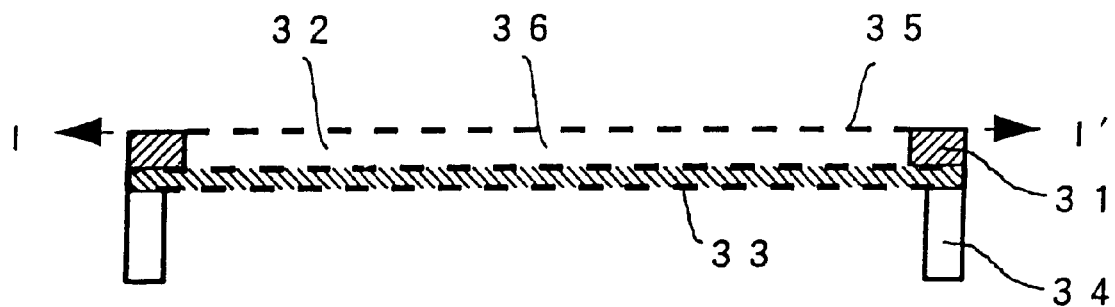
FIG. 31 is a sectional view along I–I' of FIG. 30.

A shadow mask with a structure in which a clearance 36 was formed between one face 35 of a mask portion 31 and reinforcing lines 33 as shown in FIGS. 30 and 31 was prepared for patterning the second electrodes. The shadow mask was 120×84 mm in outside form and 170 $\mu$m in the thickness of the mask portion, and had sixty six 100 mm long and 770 $\mu$m wide apertures 32 formed in stripes at a pitch of 900 $\mu$m in the crosswise direction. On the mask portion, 45 $\mu$m wide and 40 $\mu$m thick reinforcing lines with a distance of 200 $\mu$m between respective opposite two sides were formed to form regular hexagonal meshes. The height of the clearance was 170 $\mu$m, being equal to the thickness of the mask portion. The shadow mask was fixed on a 4 mm wide stainless steel frame 34 equal in outside form to the shadow mask.

The first electrodes were patterned as described below. An ITO glass substrate a with 150 nm thick transparent ITO electrode formed on the surface of a 1.1 mm thick no-alkali glass substrate by sputtering evaporation (produced by Diomateck) was cut at a size of 120×100 mm. The ITO substrate was coated with a photoresist which was exposed and developed to be patterned by ordinary photolithography. The unnecessary portions of ITO were etched, and the photoresist was removed, to pattern ITO in 90 mm long and 270 $\mu$m wide stripes. As shown in FIG. 8, 272 first electrodes 2 were formed in stripes at a pitch of 300 $\mu$m in the crosswise direction.

The spacers were formed as described below. Said ITO substrate was coated with a polyimide based photosensitive coating material (UR-3100 produced by Toray Industries, Inc.) by spin coating, and pre-baked at 80° C. for 1 hour in nitrogen atmosphere in a clean oven. Furthermore, the coating film was exposed to ultraviolet light through a photo mask, to be photoset in the desired portions, and developed using a developer (DV-505 produced by Toray Industries, Inc.). Finally, the patterned coating film was baked at 180° C. for 30 minutes, and then at 250° C. for 30 minutes in a clean oven, to form spacers 4 in the direction perpendicular to the first electrodes as shown in FIGS. 1 to 3. The transparent spacers had a length of 90 mm, width of 150 $\mu$m and height of 4 $\mu$m, and 67 spacers were arranged at a pitch of 900 $\mu$m in the crosswise direction. The spacers also had good electric insulation performance.

The ITO substrate with the spacers formed was washed, and set in a vacuum evaporator. Three shadow masks for the emitting layer and one shadow mask for the second electrodes respectively produced as described above were set in the vacuum evaporator. In the vacuum evaporator, the four shadow masks could be exchanged to be positioned with the substrate in vacuum at an accuracy of about 10 $\mu$m.

The thin film layer was formed as described below by vacuum deposition based on resistance wire heating. The degree of vacuum during vapor deposition was $2\times10^{-4}$ Pa or less, and during vapor deposition, the substrate was rotated against the evaporation source.

At first, in the arrangement as shown in FIG. 16, copper phthaiocyanine was vapor-deposited by 20 nm and bis(N-ethylcarbazole) was vapor-deposited by 200 nm on the entire surface of the substrate, to form a hole transport layer 5.

Then, a first shadow mask for the emitting layer was arranged before the substrate, and both were kept in contact with each other. Behind the substrate a ferrite magnetic shell (YBM-1B produced by Hitachi Metals, Ltd.) was arranged. In this case, as shown in FIGS. 18 and 19, the first electrodes 2 formed in stripes were located at the centers of the apertures 32 formed in stripes in the shadow mask, and the reinforcing lines 33 agreed with the spacers 4 in position and were kept in contact with the spacers by positioning both the shadow mask and the substrate. In this state, 8-hydroxyquinoline-aluminum complex ($Alq_3$) was vapor-deposited by 30 nm, to pattern the G regions of the emitting layer. Subsequently, the R regions of the emitting layer were patterned as described for patterning the G regions of the emitting layer by using a second shadow mask for the emitting lyer and vapor-depositing $Alq_3$ with 1 wt % of 4-(dicyanomethylene)-2-methyl-6-(paradimethylaminostyryl)-4-pyran (DCM) doped by 30 nm. A third shadow mask for the emitting layer was not used in this example, since the B regions of the emitting layer were not patterned.

Furthermore, in the arrangement as shown in FIG. 21, 4,4'-bis(2,2'-diphenylvinyl)biphenyl (DPVBi) was deposited by 90 nm and $Alq_3$ was deposited by 30 nm on the entire surface of the substrate, to form an electron transport layer 7 to be also used as the B regions of the emitting layer. Then, the thin film layer was exposed to lithium vapor for doping (0.5 nm as film thickness).

The second electrodes were formed as described below by vacuum vapor deposition based on resistance wire heating. During vapor deposition, the degree of vacuum was $3\times10^{-4}$ Pa or less, and the substrate was rotated against two evaporation sources.

As described for patterning the emitting layer, the shadow mask for the second electrodes was arranged before the substrate, and a magnet was arranged behind the substrate. In this case, the shadow mask and the substrate were positioned to let the spacers 4 agree with the mask portion 31 in position as shown in FIG. 7. In this state, aluminum was vapor-deposited by a thickness of 400 nm, to pattern the second electrodes 8.

Finally in the arrangement as shown in FIG. 21, silicon monoxide was deposited on the entire surface of the substrate by 200 nm by electron beam evaporation, to form a passivation layer.

Figure 32:
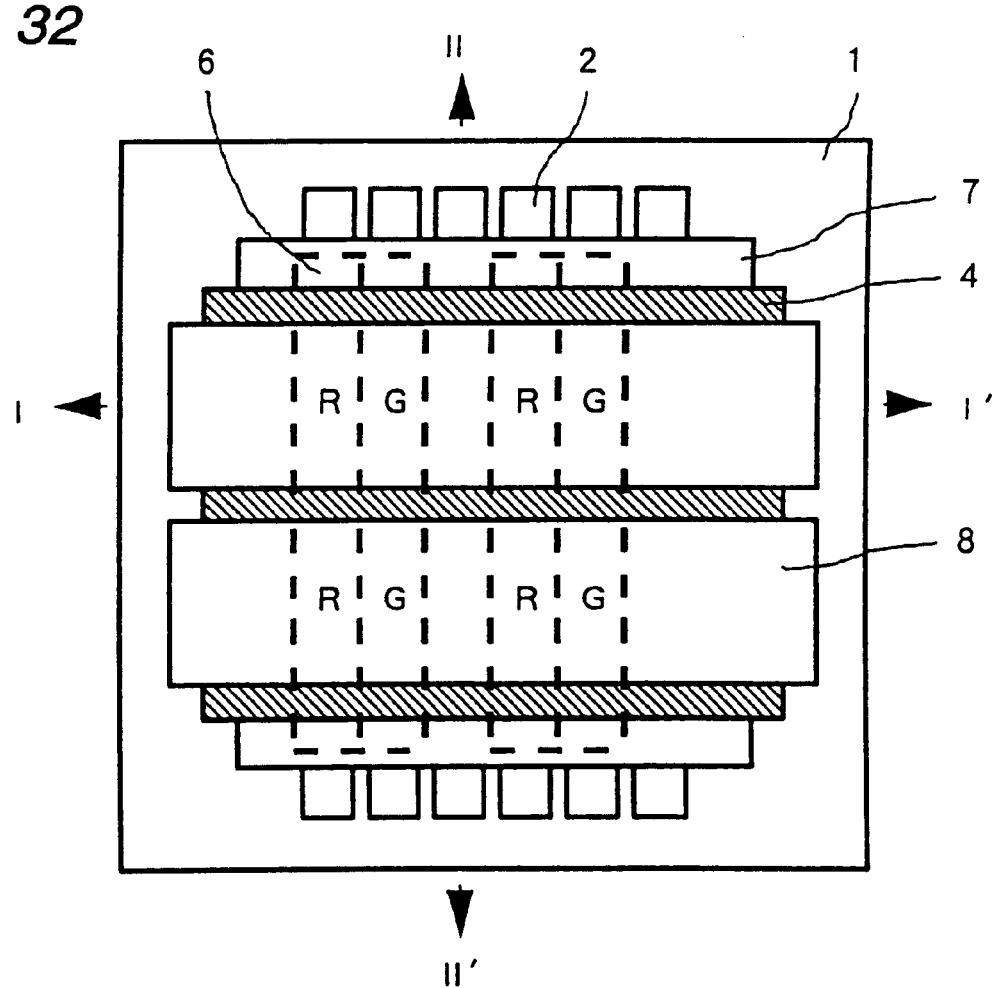
FIG. 32 is a plan view showing the organic electroluminescent device produced in Example 1.

As described above, as typically shown in FIGS. 32 to 34, a passive matrix type color electroluminescent device was produced, in which the thin film layer 10 containing the R and G regions of the emitting layer 6 and the electron transport layer 7 also used as the B regions of the emitting layer was formed by patterning on two hundred and seventy two 270 µm wide ITO first electrodes 2 formed in stripes at a pitch of 300 µm, and in which sixty six 750 µm second electrodes 8 were formed in stripes at a pitch of 900 µm in the direction perpendicular to the first electrodes. Since three luminescent regions of R, G and B regions form one pixel, the electroluminescent device had 90×66 pixels at a pitch of 900 µm.

Figure 33:
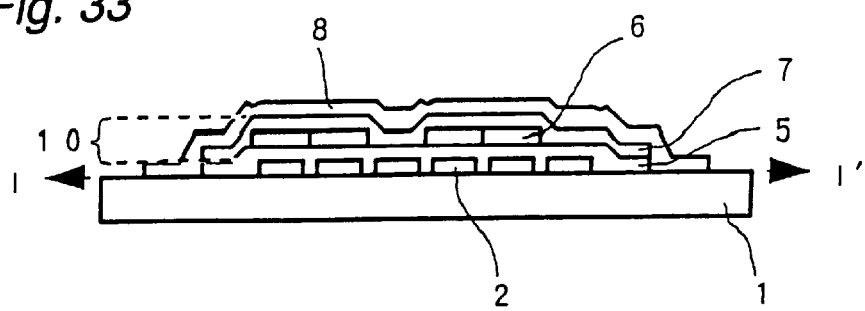
FIG. 33 is a sectional view along I–I' of FIG. 32.
Figure 34:
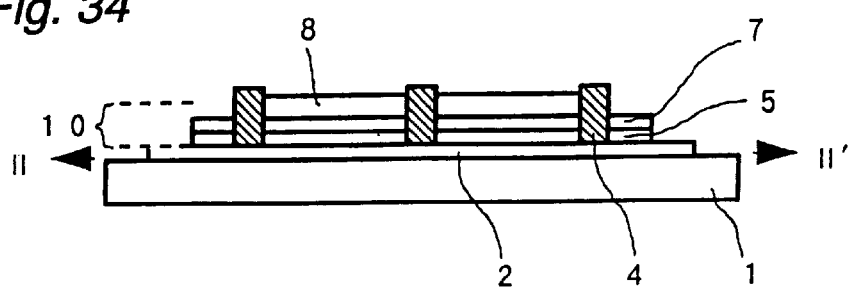
FIG. 34 is a sectional view along II–II' of FIG. 32.

In this electroluminescent device, the electron transport layer was formed on the entire surface of the substrate as shown in FIG. 33, in a structure to simplify the patterning steps and having an effect to prevent the degradation of properties of the electroluminescent device as described already. Furthermore, since three luminescent regions of three R, G and B colors were formed by two emitting layer patterning steps, the structure allowed the number of patterning steps to be decreased.

The respective second electrodes formed in stripes were not divided by the reinforcing lines of the shadow mask, and were sufficiently low in electric resistance in the longitudinal direction over 100 mm. On the other hand, the respectively adjacent second electrodes in the crosswise direction were not shortcircuited at all, being perfectly insulated from each other.

The luminescent regions of the electroluminescent device emitted light in respectively independent colors of R, G and B uniformly in sizes of 270×750 µm. Furthermore, the decline of emitted light purity of the luminescent regions due to the straying of the luminescent materials during the patterning of the emitting layer was not observed.

Furthermore, when the electroluminescent device was driven line-scanningly by a line-scanning drive circuit capable of discharging the charges accumulated in the circuit when the scanning line was selectively changed, clear patterns could be displayed in multicolor.

EXAMPLE 2

The process till the formation of the hole transport layer was the same as described for Example 1.

Then, a first shadow mask for the emitting layer was arranged before the substrate, and they were kept in contact with each other. Behind the substrate, a ferrite magnetic shell (YMB-1B produced by Hitachi Metals, Ltd.) was arranged. In this case, as shown in FIGS. 18 and 19, the shadow mask and the substrate were positioned to ensure that the first electrodes 2 formed in stripes were located at the centers of the apertures 32 formed in stripes in the shadow mask, and that the reinforcing lines 33 agreed with the spacers 4 in position and were kept in contact with the spacers. In this state, $Alq_3$ was vapor-deposited by 30 nm, to pattern the G regions of the emitting layer. Then, as described for patterning the G regions of the emitting layer, a second shadow mask for the emitting layer was used to deposit $Alq_3$ with 1 wt % of DCM doped by 40 nm, for patterning the R regions of the emitting layer. Furthermore, similarly, a third shadow mask for the emitting layer was used to deposit DPVBi by 30 nm, for patterning the B regions of the emitting layer.

The respective regions of the emitting layer were arranged for every three first electrodes 2 formed in stripes as shown in FIG. 20, to perfectly cover the exposed portions of the first electrodes.

Furthermore, in the arrangement shown in FIG. 21, DPVBi was deposited by 90 nm and $Alq_3$ was deposited by 30 nm on the entire surface of the substrate, to form an electron transport layer 7. Then, the thin film layer 10 was exposed to lithium vapor, for doping (0.5 nm as the film thickness).

Subsequently, the second electrodes were patterned and a passivation layer was formed as described for Example 1.

As described above, as typically shown in FIGS. 1 to 3, a passive matrix type color electroluminescent device was produced, in which the thin film layer 10 containing the patterned R, G and B regions of the emitting layer 6 was formed on two hundred and seventy two 270 µm wide TIO first electrodes formed in stripes at a pitch of 300 µm, and in which sixty six 750 µm wide second electrodes 8 were formed in stripes at a pitch of 900 µm in the direction perpendicular to the first electrodes. Since three luminescent regions of R, G and B form one pixel, the electroluminescent device had 90×66 pixels at a pitch of 900 µm.

In the electroluminescent device, as shown in FIG. 2, the electron transport layer was formed on the entire surface of the substrate in a structure to simplify the patterning steps and having an effect to prevent the degradation of properties of the electroluminescent device already described before.

The second electrodes formed in stripes were sufficiently low in electric resistance in the longitudinal direction as in Example 1, and perfectly free from shortcircuiting.

The luminescent regions of the produced electroluminescent device luminescentted light in respectively independent R, G and B colors in sizes of 270×750 µm. Furthermore, the decline in the luminescentted light color purity of the luminescent regions due to the straying of the luminescent materials during patterning of the emitting layer was not observed.

As described for Example 1, the electroluminescent device was driven line-scanningly, and clear patterns could be displayed in multicolor.

EXAMPLE 3

As described for Example 1, the ITO was patterned as first electrodes in 90 mm long and 280 µm wide stripes, and the photoresist was removed. As described for Example 1, 272 first electrodes were formed in strips on a glass substrate at a pitch of 300 µm in the crosswise direction.

The spacers were formed as described below. Glycidyl methacrylate was added to a copolymer consisting of 40% of methacrylic acid, 30% of methyl methacrylate and 30% of styrene by 0.4 equivalent for each equivalent of the carboxyl groups of the copolymer for reaction, to obtain an acrylic copolymer with carboxyl groups and ethylene unsaturated groups as side chains. Two hundred parts by weight of cyclohexane were added to 50 parts by weight of the acrylic copolymer, 20 parts of a bifunctional urethane acrylate oligomer (UX-4101 produced by Nippon Kayaku Co., Ltd.)

as a photoreactive compound and 20 parts by weight of hydroxypivalate neopentyl glycol diacrylate (HX-220 produced by Nippon Kayaku Co., Ltd.) as an acrylic monomer, and the mixture was stirred at room temperature for 1 hour, to obtain a resin solution. To the resin solution, 8 parts by weight of diethylthioxanthone (DETX-S produced by Nippon Kayaku Co., Ltd.) as a photopolymerization initiator and 3 parts by weight of ethyl p-dimethylaminobenzoate (EPA produced by Nippon Kayaku Co., Ltd.) as a sensitizer were added, and furthermore, a methyl ethyl ketone/methyl isobutyl ketone solution containing 30 wt % of an oil soluble azo chromium complex salt dye (3804T produced by Orient Kagaku) and phthalocycanine black pigment were added as colorants. The mixture was stirred at room temperature for 20 minutes, to obtain a photosensitive black paste.

The photosensitive black paste was adjusted in concentration and applied onto said ITO substrate by spin coating and pre-baked at 80° C. in nitrogen atmosphere for 5 minutes in a clean oven. Furthermore, said coating film was exposed to ultraviolet light through a photo mask, to be photoset in the desired portions, and developed by 0.4 vol % 2-aminoethanol aqueous solution. Finally the patterned coating film was baked in a clean oven at 120° C. for 30 minutes, to form first spacers 3 in matrix as shown in FIGS. 13 to 15. The black spacers had a height of 0.5 μm, and in regions of 270×750 μm free from these spacers, the first electrodes were exposed. The first spacers were formed so that they cover the 5 μm ends of the first electrodes.

Furthermore, the photosensitive black paste was used to form sixty seven 90 mm long, 130 μm wide and 4 μm high second spacers 4 at a pitch of 900 μm in the crosswise direction on the first spacers in the direction perpendicular to the first electrodes as shown in FIGS. 13 to 15 according to similar photolisography. The two kinds of spacers had good electric insulation performance respectively.

As described for Example 1 except the above operation, a passive matrix type color electroluminescent device as typically shown in FIGS. 13 to 15 was produced. Since three emitting areas of R, G and B form one pixel, the electroluminescent device had 90×66 pixels at a pitch of 900 mm.

The second electrodes formed in stripes were sufficiently low in electric resistance in the longitudinal direction as in Example 1 and perfectly free from shortcircuiting.

The luminescentluminescent regions of the produced electroluminescent device emitted light in respectively independent colors of R, G and B in sizes of 270×750 μm. The decline in luminescent color purity of the luminescent regions due to the straying of luminescent materials during patterning of the emitting layer was not observed either.

As in Example 1, when the electroluminescent device was driven line-scanningly, clear patterns could be displayed in multicolor. Furthermore, since black spacers were formed around the luminescent regions, they functioned as a black matrix, to improve the display contrast compared to Examples 1, and 2.

COMPARATIVE EXAMPLE 1

A passive matrix type color electroluminescent device was produced as described for Example 1, except that spacers were not formed.

As in Example 1, the second electrodes formed in stripes were not divided by the reinforcing lines of the shadow mask and were sufficiently low in electric resistance in the longitudinal direction over 100 mm, and the respectively adjacent second electrodes in the crosswise direction were not shortcircuited at all. Furthermore, the luminescent regions emitted light in respectively independent colors of R, G and B in sizes of 270×750 μm, and the decline in the luminescent color purity of the respective luminescent regions due to the straying of luminescent materials during patterning of the emitting layer was not observed either.

However, when the electroluminescent device was driven line-scanningly, the existence of non-luminescent regions was outstanding and crosstalk occurred. So, clear patterns could not be displayed.

COMPARATIVE EXAMPLE 2

A passive matrix type color electroluminescent device was produced as described for Example 1, except that shadow masks used for the emitting layer did not have the reinforcing lines though having the identically formed apertures.

As in Example 1, the second electrodes formed in stripes were not divided by the reinforcing lines of the shadow mask, and were sufficiently low in electric resistance in the longitudinal direction over 100 mm, and the respectively adjacent second electrodes in the crosswise direction were not shortcircuited at all. The luminescent regions were formed in sizes of 270×750 μm.

However, due to the straying of the luminescent materials during the patterning of the emitting layer, the colors emitted in the respective luminescent regions had R, G and B mixed. Furthermore, due to the thickness fluctuation of the emitting layer, the respective luminescent regions were uneven in luminance.

The electroluminescent device was driven line-scanningly. Clear patterns could be displayed, but multicolor was obscure.

COMPARATIVE EXAMPLE 3

A passive matrix type color electroluminescent device was produced as described for Example 1, except that the shadow mask used for the second electrodes had no reinforcing lines formed in meshes though having identically formed apertures.

However, the second electrodes formed in stripes varied greatly in width in the longitudinal direction, and some second electrodes were disconnected halfway in the longitudinal direction. Many respectively adjacent second electrodes in the crosswise direction were perfectly shortcircuited. The luminescent regions were also very different in size. The electroluminescent device was driven line-scanningly, but no pattern could be displayed since the respectively adjacent second electrodes were shortcircuited.

EXAMPLE 4

For patterning the emitting layer, shadow masks with a structure in which the mask portion and the reinforcing lines were formed on the same plane as shown in FIG. 17 were prepared. Each of the shadow masks was 120×84 mm in outside form and had a thickness of 25 μm in the mask portion 31, having two hundred and seventy two 64 mm long and 105 μm wide apertures 32 formed in stripes at a pitch of 300 μm in the crosswise direction. At the apertures formed in stripes, 20 μm wide and 25 μm thick reinforcing lines 33 were formed across the apertures at 1.8 mm intervals. Each of the shadow masks was fixed on a 4 mm wide stainless steel frame 34 equal in outside form to the shadow mask.

For patterning the second electrodes, a shadow mask with a structure in which a clearance 36 was formed between one face 35 of the mask portion 31 and the reinforcing lines 33 as shown in FIGS. 30 and 31 was prepared. The shadow mask was 120×84 mm in outside form and had a thickness of 100 μm in the mask portion, having two hundred 100 mm long and 245 μm wide apertures 32 formed in stripes at a pitch of 300 μm in the crosswise direction. On the mask portion, 40 μm wide and 35 μm thick reinforcing lines with a distance of 200 μm between respectively opposite two sides were formed to form regular hexagonal meshes. The height of the clearance was 100 μm, being equal to the thickness of the mask portion. Furthermore, the shadow mask was fixed on a 4 mm wide stainless steel frame 34 equal in outside form to the shadow mask.

At first, as described for Example 1, first electrodes of ITO were patterned in 90 mm long and 70 μm wide stripes. As shown in FIG. 8, 816 first electrodes 2 were formed in stripes at a pitch of 100 μm in the crosswise direction.

Then, according to photolithography as in Example 1, spacers 4 were formed in the direction perpendicular to the first electrodes as shown in FIGS. 1 to 3. The spacers were 201 transparent spacers with a length of 90 mm, width of 60 μm and height of 4 μm formed at a pitch of 300 μm in the crosswise direction. The spacers had good electric insulation performance.

The above shadow masks were used to produce a passive matrix type color electroluminescent device as described for Example 1. In the electroluminescent device, as typically shown in FIGS. 32 to 34, a thin film layer 10 containing an emitting layer 6 with patterned R and G regions and an electron transport layer 7 also used as an emitting layer with B regions was formed on the eight hundred and sixteen 70 μm wide ITO first electrodes 2 formed in stripes at a pitch of 100 μm, and two hundred 240 μm wide second electrodes 8 were formed in stripes at a pitch of 300 μm in the direction perpendicular to the first electrodes. Since three luminescent regions of R, G and B form one pixel, the electroluminescent device had 272×200 pixels at a pitch of 300 μm. The second electrodes formed in stripes were not divided by the reinforcing lines of the shadow mask, and were sufficiently low in electric resistance in the longitudinal direction over 100 mm. On the other hand, the respectively adjacent second electrodes in the crosswise direction were not shortcircuited at all, being perfectly insulated.

The luminescent regions of the electroluminescent device emitted light uniformly in respectively independent colors of R, G and B in sizes of 70×240 μm. Furthermore, the decline in the luminescentted light color purity of the luminescent regions due to the straying of the luminescent materials during patterning of the emitting layer was not observed either.

The electroluminescent device was driven line-scanningly by a line-scanning drive circuit capable of discharging the charges accumulated in the circuit when the scanning line was selectively changed, clear patterns could be displayed in multicolor.

INDUSTRIAL AVAILABILITY

In the method for producing an organic electroluminescent device of the present invention, since the shadow mask is kept in contact with the spacers having a height at least partially exceeding the thickness of the thin film layer, the thin film layer is not flawed. So, the properties of the organic electroluminescent elements are not degraded. This effect is especially large when magnetic force is used to improve the contact between the substrate and the shadow mask or to relatively position both of them.

In addition, since the reinforcing lines are used to prevent the apertures of the shadow mask from being deformed, the fine patterning of the emitting layer, second electrodes, etc. by masking can be achieved at high accuracy.

Furthermore, as described in the method for patterning the second electrodes, since the deposit can be deposited also behind the reinforcing lines, patterning can be achieved at high accuracy even under conditions of various vapor deposition angles. Therefore, many evaporation sources can be used for vapor deposition, and sputtering evaporation, etc. can also be used. So, the effect is especially large when uniform patterning in a wide area is intended.

Moreover, since any desired form can be patterned by one vapor deposition step, the number of production steps can be decreased. Furthermore, the electroluminescent device to be produced is not limited in structure.

What is claimed is:

1. An organic electroluminescent device comprising a first electrode formed on a substrate, a film layer on the first electrode and a second electrode formed on the film layer, said film layer comprising at least an emitting layers comprising a vapor deposited material, wherein a portion where no emitting layer exists is present between emitting layers of a same color.

2. An organic electroluminescent device of claim 1, wherein a width of the portion where no emitting layer exists is 50 micrometer or less.

3. An organic electroluminescent device of claim 1, wherein the portion where no emitting layer exists is present in a non-luminescent region.

* * * * *